(12) United States Patent
Shinohara

(10) Patent No.: US 8,580,335 B2
(45) Date of Patent: Nov. 12, 2013

(54) METHOD FOR DISCHARGING LIQUID BODY, METHOD FOR MANUFACTURING COLOR FILTER, AND METHOD FOR MANUFACTURING ORGANIC EL DEVICE

(75) Inventor: Toru Shinohara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 715 days.

(21) Appl. No.: 12/562,801

(22) Filed: Sep. 18, 2009

(65) Prior Publication Data

US 2010/0099325 A1  Apr. 22, 2010

(30) Foreign Application Priority Data

Oct. 16, 2008 (JP) ................................. 2008-267144

(51) Int. Cl.
*B05D 5/06* (2006.01)
(52) U.S. Cl.
USPC ............ 427/162; 427/66; 427/98.4; 427/157; 427/256
(58) Field of Classification Search
USPC ............................ 427/162, 66, 256, 98.4, 157
See application file for complete search history.

(56) References Cited

U.S. PATENT DOCUMENTS

| | | | |
|---|---|---|---|
| 2004/0008243 A1 | 1/2004 | Sekiya | |
| 2004/0023567 A1* | 2/2004 | Koyama et al. | 439/894 |
| 2006/0119629 A1 | 6/2006 | An et al. | |
| 2007/0042111 A1* | 2/2007 | Koyama | 427/64 |
| 2007/0075627 A1* | 4/2007 | Kimura et al. | 313/503 |
| 2009/0122110 A1 | 5/2009 | Yoshioka | |

FOREIGN PATENT DOCUMENTS

| | | | |
|---|---|---|---|
| JP | 2003-338370 A | | 11/2003 |
| JP | 2006-187758 | * | 7/2006 |
| JP | 2006-187758 A | | 7/2006 |
| JP | 2007-136330 A | | 6/2007 |
| JP | 2007-190507 A | | 8/2007 |
| JP | 2008-162020 | * | 7/2008 |

* cited by examiner

*Primary Examiner* — Elizabeth Burkhart
(74) *Attorney, Agent, or Firm* — Global IP Counselors, LLP

(57) ABSTRACT

A method for discharging a liquid body includes: discharging the liquid body to a discharged region from a plurality of nozzles while a plurality of droplet discharge heads having a nozzle line having the plurality of nozzles that discharge the liquid body as droplets and are arranged in a linear manner, and a substrate including a plurality of discharged regions having a nearly rectangular shape are relatively moved in a main scan direction that is nearly orthogonal to an arrangement direction of the droplet discharge heads. In the method, the plurality of discharged regions are composed of a first discharged region and a second discharged region. The first discharged region is disposed on the substrate to set a long side thereof along a certain direction, and the second discharged region has a smaller area than the first discharged region and is disposed to set a long side thereof nearly orthogonal to the long side of the first discharged region. Further, the first discharged region is disposed to set the long side thereof along the main scan direction in the discharging.

6 Claims, 15 Drawing Sheets

METHOD FOR DISCHARGING LIQUID BODY, METHOD FOR MANUFACTURING COLOR FILTER, AND METHOD FOR MANUFACTURING ORGANIC EL DEVICE

CROSS-REFERENCE TO RELATED APPLICATIONS

This application claims priority to Japanese Application No. 2008-267144 filed on Oct. 16, 2008. The entire disclosure of Japanese Application No. 2008-267144 is incorporated herein by reference.

BACKGROUND

1. Technical Field

The present invention relates to a method for discharging a liquid body which is discharged from a nozzle, a method for manufacturing a color filter, and a method for manufacturing an organic EL device.

2. Related Art

Methods for discharging a liquid body containing a functional material are applied to form films for color filters of liquid crystal displays and organic EL devices, for example. A liquid body discharge device is used to discharge the liquid body. The liquid body discharge device includes a droplet discharge mechanism called a droplet discharge head. The droplet discharge head has a plurality of nozzles arranged in a regular manner. In manufacturing the color filters and organic EL devices, liquid bodies containing functional materials are discharged as droplets to a substrate or the like from the nozzles to form thin films made of the functional materials.

Recently, display devices have been widely used and provided with various sized panels. There have been also demands for the display devices with high image quality. In order to meet the demands, films for color filters and organic EL devices are required to be precisely formed in high density. Accordingly, it has become important that liquid bodies are precisely discharged in high density to substrates of various sizes. In addition, there are demands for manufacturing a multitude of panels from a single large substrate for improving panel productivity to meet an increasing demand for panels of display devices. In this case, various layouts are examined to increase the efficiency of the number of panels per substrate or to manufacture panels having different sizes from a single substrate. Pixel regions, which are minimum units of a region to which the liquid body is discharged, may be arranged such that one pixel region is disposed to make an angle of 90 degrees with another pixel region depending on a layout.

JP-A-2006-187758, for example, discloses such a droplet discharge device that discharges a liquid body from a droplet discharge head to a workpiece (substrate) as a droplet and a method for discharging a droplet in which, while the workpiece is moved in a first direction and a second direction perpendicular to the first direction, the liquid body is discharged from nozzles of the droplet discharge head disposed in a plurality of carriages having been positioned in advance in the second direction to draw a pattern.

The droplet discharge device of the above example discharges the liquid body to a predetermined region on the substrate from the nozzles having been positioned in advance. The nozzles are arranged in a linear manner at a constant pitch. The pixel region serving as the minimum unit region to which the liquid body is discharged is formed in an approximately rectangular shape. Therefore, it is preferable that the pixel region be disposed in a manner setting its long side in parallel with the nozzle line so as to allocate as many nozzles as possible opposed to the pixel region for dispersing variations of a discharge property of the nozzles. However, when pixel regions having different arrangement directions from each other are formed on a substrate in a mixed manner, short sides of some pixel regions are parallel to the nozzle line. In this case, nozzles which can discharge the liquid body to the region are limited, and therefore the liquid body is discharged to a certain part of the region, causing uneven discharge amount of the liquid body. The uneven discharge amount of the liquid body may cause uneven thickness of a thin film formed in the region. The uneven thickness of the thin film such as functional films of color filters of liquid crystal displays and organic EL devices causes deterioration of the image quality of manufactured displays.

SUMMARY

The invention intends to solve at least part of the above problem, and can be realized by the following aspects.

A method for discharging a liquid body according to a first aspect of the invention, includes: discharging the liquid body to a discharged region from a plurality of nozzles while a plurality of droplet discharge heads, which have a nozzle line having the plurality of nozzles that discharge the liquid body as droplets and are arranged in a linear manner, and a substrate, which includes a plurality of discharged regions having a nearly rectangular shape, are relatively moved in a main scan direction that is nearly orthogonal to an arrangement direction of the droplet discharge heads. In the method, the plurality of discharged regions are composed of a first discharged region and a second discharged region. The first discharged region is disposed on the substrate to set a long side thereof along a certain direction, and the second discharged region has a smaller area than the first discharged region and is disposed to set a long side thereof nearly orthogonal to the long side of the first discharged region. Further, the first discharged region is disposed to set the long side thereof along the main scan direction in the discharging.

According to the method of the first aspect, the droplet discharge heads having the nozzle line can be arranged in the same direction as that of the short side of a nearly rectangular shape of the first discharged region having a large area, and in the same direction as that of the long side of a nearly rectangular shape of the second discharged region having a small area. That is, the nozzles can be arranged in a direction of the short side of the nearly rectangular shape of the first discharged region having the large area and in a direction of the long side of the nearly rectangular shape of the second discharged region having the small area. Therefore, even if the first discharged region and the second discharged region that have the different areas from each other are mixed in a single substrate, more number of nozzles, which can discharge the liquid body in the discharged regions, can be allocated. This reduces concentrated discharge of the liquid body to a certain part in the discharged region and resulting imbalance of the discharge amount of the liquid body. Consequently, unevenness of thickness of thin films formed in the discharged regions can be reduced. Accordingly, the method enables at least two kinds of thin films to be manufactured with stable quality, contributing to improve the productivity of the films.

In the method of the first aspect, at least two nozzles may face a region, in a direction of the short side of the first discharged region, of the first discharged region.

According to the method, the plurality of nozzles can be allocated opposed to the first discharged region so as to discharge the liquid body to the first discharged region. Therefore, even if a discharge property varies in the nozzles, the variation of the discharge property can be dispersed by using a plurality of nozzles. Consequently, unevenness of thickness of thin films formed in the discharged regions can be reduced.

In the method of the first aspect, an arranging pitch between the droplets, which are discharged from the nozzles and arranged in the first discharged region, in the direction of the short side of the first discharged region can be adjusted by disposing the nozzle line at an angle with the direction of the short side.

According to the method, the arranging pitch between the droplets arranged in the direction of the short side of the first discharged region can be practically narrowed by disposing the nozzle line of the droplet discharge heads at an angle with the direction of the short side of the first discharged region. That is, more number of nozzles can be allocated opposed to the first discharged region so as to discharge the liquid body to the first discharged region. This reduces concentrated discharge of the liquid body to a certain part in the discharged region and resulting imbalance of the discharge amount of the liquid body. Consequently, unevenness of thickness of thin films formed in the discharged regions can be reduced.

In the method of the first aspect, in the discharging, the droplet discharge heads and the substrate may be relatively moved in a sub scan direction that is nearly orthogonal to the main scan direction in a plurality of relative moves between the droplet discharge heads and the substrate in the main scan direction.

According to the method, in the discharging, the liquid body can be discharged from the nozzles to the discharged regions while the droplet discharge heads and the substrate are relatively moved in the sub scan direction which is orthogonal to the main scan direction, that is, while a line feeding is performed. For example, the number of droplets which can be arranged in the direction of the short side of the first discharged region can be practically increased. This reduces concentrated discharge of the liquid body to a certain part in the discharged region and resulting imbalance of the discharge amount of the liquid body. Consequently, unevenness of thickness of thin films formed in the discharged regions can be reduced.

A method for manufacturing a color filter according to a second aspect of the invention, includes: discharging liquid bodies, which contain a colored layer forming material, of a plurality of colors to a plurality of discharged regions by using the method for discharging a liquid body of the first aspect; and solidifying the liquid bodies being discharged so as to form colored layers of the plurality of colors on a substrate. In the method, the plurality of discharged regions are composed of first discharged regions and second discharged regions having an arrangement direction orthogonal to that of the first discharged regions.

The method of the second aspect can reduce unevenness of the thickness of the colored layers formed in the first discharged region and the second discharged region having arranging directions orthogonal to each other, and manufacture at least two kinds of color filters, which include colored layers having different arranging directions from each other, with high productivity.

According to a third aspect of the invention, a method for manufacturing an organic electroluminescence (EL) device including a plurality of organic EL elements having functional layers having light emitting layers, in a plurality of discharged regions on a substrate, includes: discharging a liquid body containing a light emitting layer forming material in the plurality of discharged regions on the substrate by using the method for discharging a liquid body of the first aspect; and solidifying the liquid body being discharged so as to form the light emitting layers. In the method, the plurality of discharged regions are composed of first discharged regions and second discharged regions having an arrangement direction orthogonal to that of the first discharged regions.

The method of the third aspect can reduce unevenness of the thickness of the light emitting layers formed in the first discharged region and the second discharged region having arranging directions orthogonal to each other, and manufacture at least two kinds of organic EL devices, which have organic EL elements arranged in different directions from each other, with high productivity.

BRIEF DESCRIPTION OF THE DRAWINGS

The invention will be described with reference to the accompanying drawings, wherein like numbers reference like elements.

DESCRIPTION OF EXEMPLARY EMBODIMENT

The invention is described by referring to an exemplified case of manufacturing a color filter having a plurality of colored layers in a plurality of pixel regions which are formed on a substrate. The colored layer, which is an element of a pixel, is formed by discharging a liquid body, which contains a colored layer forming material, as droplets from a plurality of nozzles to a pixel region. A liquid body discharge device described below is used for discharging the liquid body as the droplets.

Structure of Liquid Body Discharge Device

Figure 1:
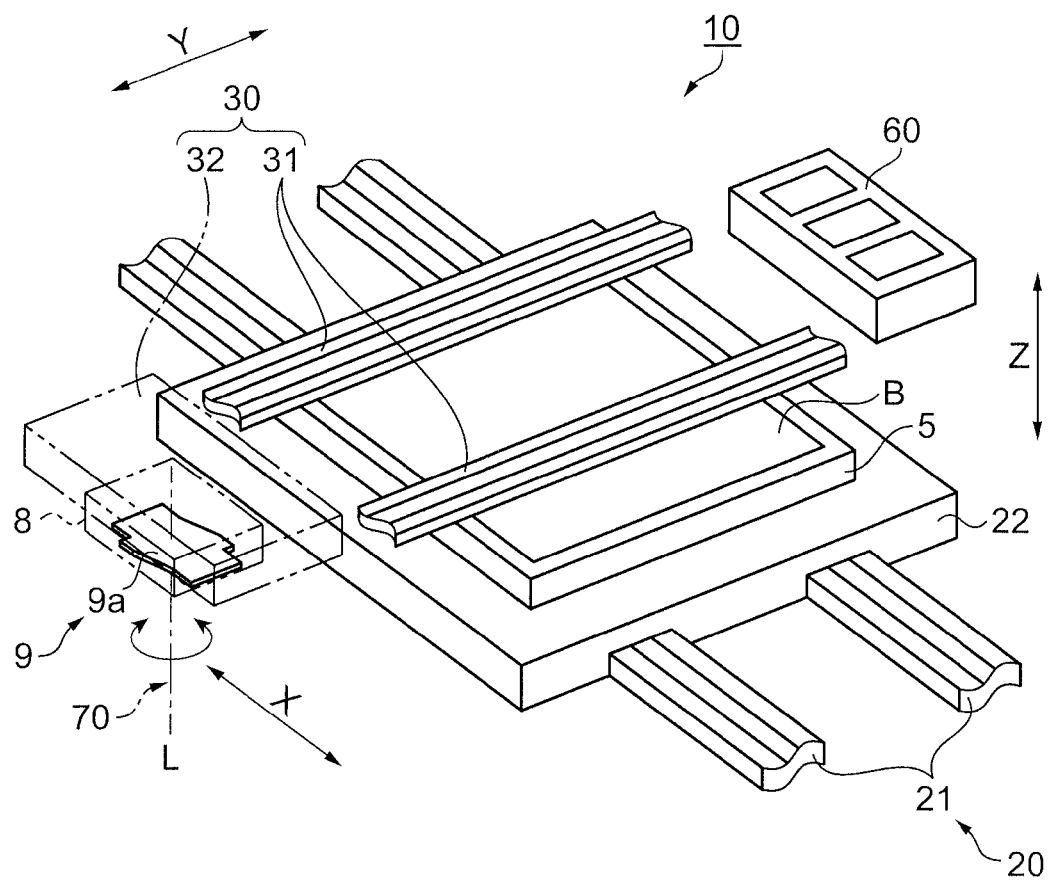
FIG. 1 is a perspective view schematically showing a structure of a liquid body discharge device.

A liquid body discharge device including a droplet discharge head that discharges a liquid body is first described with reference to FIG. 1. FIG. 1 is a perspective view schematically showing a structure of a liquid body discharge device.

As shown in FIG. 1, a liquid body discharge device 10 includes a substrate moving mechanism 20 that moves a substrate B, which has a discharged region (a film forming region), in a main scan direction, and a head moving mechanism 30 that moves a head unit 9, which has a plurality of droplet discharge heads, in a sub scan direction. The liquid body discharge device 10 discharges a liquid body as droplets from a plurality of droplet discharge heads provided to the head unit 9 while changing a relative position between the substrate B and the head unit 9. Thus a predetermined functional film is formed on the substrate B with the liquid body. In FIG. 1, an X direction indicates a direction in which the substrate B moves, i.e., the main scan direction, a Y direction indicates a direction in which the unit 9 moves, i.e., the sub scan direction, and a Z direction indicates a direction which is orthogonal to the X direction and the Y direction.

For example, when a color filter having filter elements of three colors which are red, green, and blue is manufactured by using the liquid body discharge device 10, the liquid bodies of three colors which are red, green, and blue are discharged from the droplet discharge heads of the liquid body discharge device 10 as droplets to respective film forming regions on the substrate B, thereby forming filter elements of the three colors which are red, green, and blue.

Here, each component of the liquid body discharge device 10 is described.

The substrate moving mechanism 20 includes a pair of guide rails 21, a moving table 22 which moves along the pair of guide rails 21, and a stage 5 which is provided on the moving table 22 and is capable of sucking and fixing the substrate B thereon. The moving table 22 is moved in the X direction (the main scan direction) by an air slider and a linear motor, which are not shown but disposed inside the guide rails 21.

The head moving mechanism 30 includes a pair of guide rails 31 and a first moving stage 32 moving along the pair of guide rails 31. The first moving stage 32 is provided with a carriage 8. The carriage 8 includes the head unit 9 to which a plurality of droplet discharge heads 50 (refer to FIG. 2) are attached with a head unit rotating mechanism 70. The head unit 9 can rotate around a rotating axis L shown in FIG. 1 on an XY plane due to the head unit rotating mechanism 70. The first moving stage 32 moves the carriage 8 in the Y direction (the sub scan direction) so as to dispose the head unit 9 opposed to the substrate B with a predetermined space in the Z direction.

The liquid body discharge device 10 further includes a maintenance mechanism 60 which performs maintenance such as eliminating clogging of the nozzles of the plurality of droplet discharge heads 50 attached to the head unit 9. The liquid body discharge device 10 also includes a liquid body supply mechanism for supplying the liquid body to the droplet discharge heads 50, and a discharge amount measurement mechanism including measuring equipment such as an electronic balance which receives the liquid body discharged from each of the droplet discharge heads 50 or each of the nozzles so as to measure an discharge amount. These mechanisms are controlled by a controller 4 (refer to FIG. 4). FIG. 1 does not show the controller 4, the liquid body supply mechanism, and the discharge amount measurement mechanism.

Droplet Discharge Head

Figure 2A:
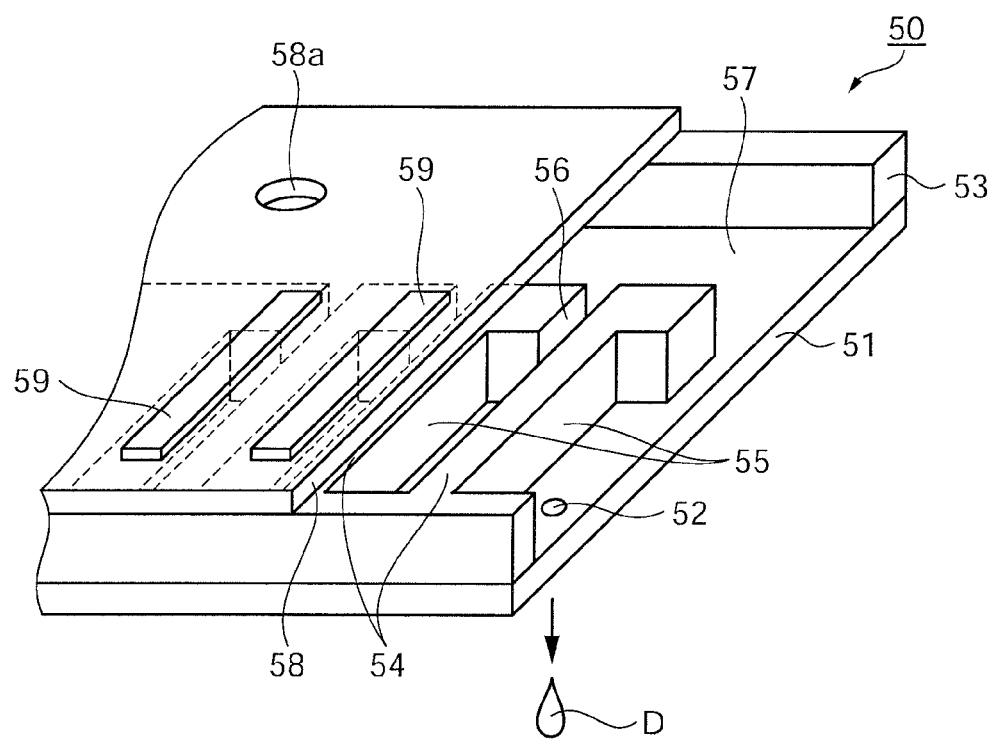
FIGS. 2A and 2B are schematic views showing a structure of a droplet discharge head.
Figure 2B:
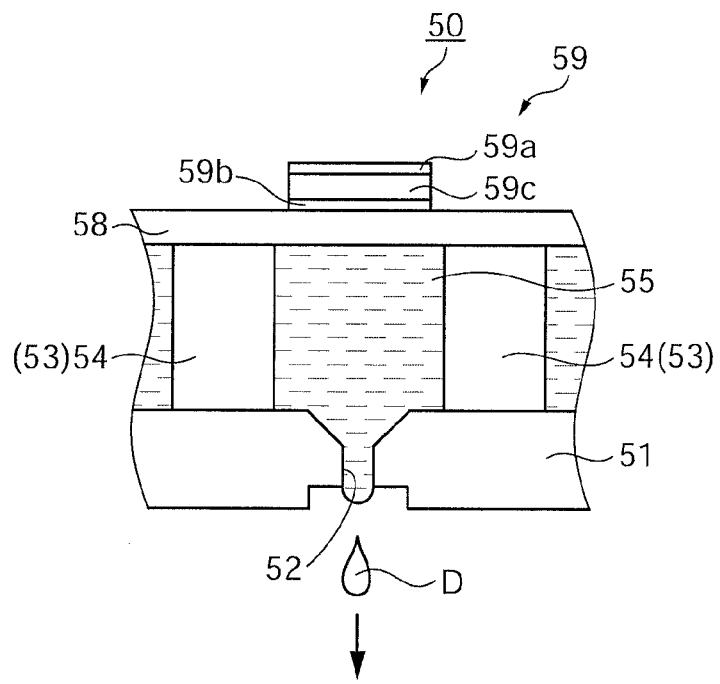
Figure 3:
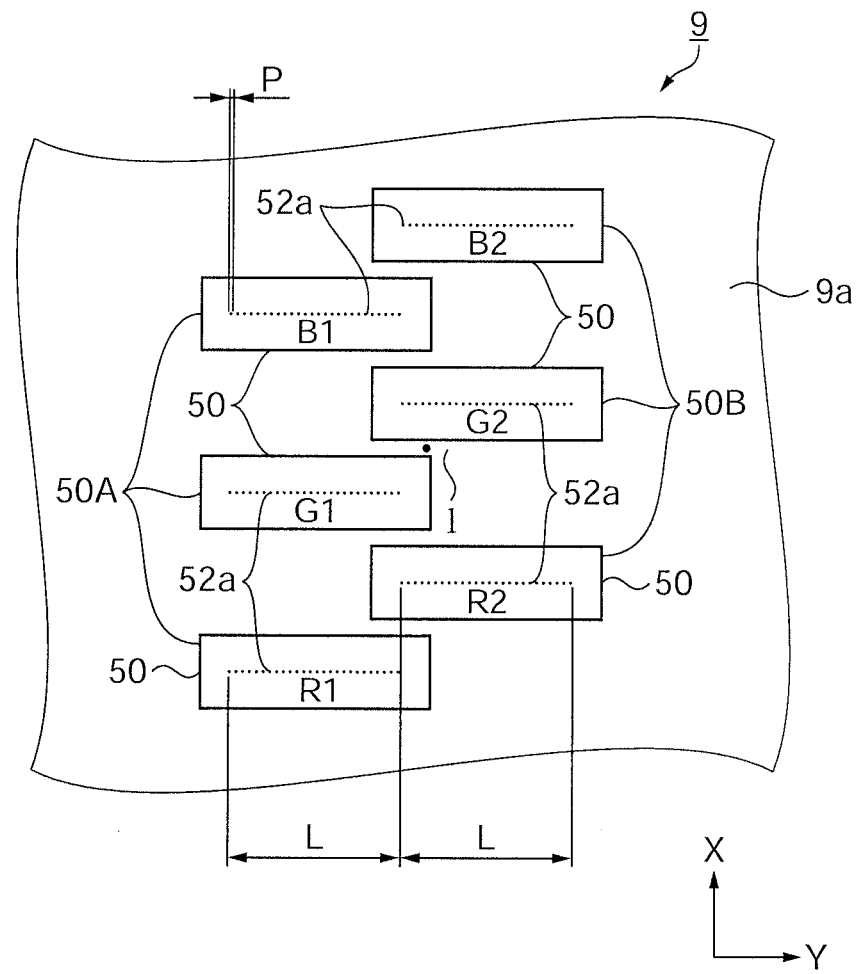
FIG. 3 is a schematic plan view showing an arrangement of droplet discharge heads in a head unit.

Here, the droplet discharge head including a plurality of nozzles is described with reference to FIG. 2A to FIG. 3. FIGS. 2A and 2B are schematic views showing a structure of the droplet discharge head. FIG. 2A is a schematic exploded perspective view, and FIG. 2B is a sectional view showing a structure of a nozzle section. FIG. 3 is a schematic plan view showing an arrangement of the droplet discharge heads in the head unit. Specifically, it is viewed from a side facing the substrate B. The X direction and the Y direction shown in FIG. 3 respectively indicate the same directions as the X direction and the Y direction of FIG. 1.

As shown in FIGS. 2A and 2B, the droplet discharge head 50 is structured by sequentially laminating and bonding a nozzle plate 51 having a plurality of nozzles 52 that discharge liquid droplets D, a cavity plate 53 having partition walls 54 for forming cavities 55 each of which communicates with one of the nozzles 52, and an vibration plate 58 having vibrators 59 each of which corresponds to one of the cavities 55 as a driving element.

The cavity plate 53 has the partition walls 54 forming the cavities 55 communicating with the nozzles 52, and flow paths 56 and 57 for filling the cavities 55 with the liquid body. The flow path 57 is sandwiched between the nozzle plate 51 and the vibration plate 58, and a resulting space serves as a reservoir for reserving the liquid body. The liquid body is supplied from the liquid body supply mechanism through a piping and a supply hole 58a formed in the vibration plate 58 to be reserved in the reservoir. Thereafter the liquid body flows through the flow path 56 to fill each of the cavities 55.

As shown in FIG. 2B, the vibrator 59 is a piezoelectric element that is composed of a piezo element 59c and a pair of electrodes 59a and 59b sandwiching the piezo element 59c. A driving waveform is externally applied to the pair of electrodes 59a and 59b as a driving signal to deform the vibration plate 58 bonded with the vibrator 59. This deformation increases a volume of the cavity 55 defined by the partition walls 54, thereby drawing the liquid body into the cavity 55 from the reservoir. Then, on completion of applying the driving waveform, the vibration plate 58 returns to have its original shape and pressurizes the liquid body which fills the cavity 55. Accordingly, the liquid body can be discharged as the droplets D from the nozzle 52. Controlling the driving waveform applied to the piezo element 59c allows controlling discharge of the liquid body of each of the nozzles 52.

The droplet discharge heads 50 are arranged on a head plate 9a of the head unit 9 as shown in FIG. 3. On the head plate 9a, a head group 50A composed of three droplet discharge heads 50 and a head group 50B also composed of three droplet discharge heads 50, i.e., a total of six droplet discharge heads 50 are disposed. In this case, the droplet discharge head 50 (a head R1) of the head group 50A discharges the same kind of liquid body as the droplet discharge head 50 (a head R2) of the head group 50B discharges. The heads G1 and G2 and the heads B1 and B2 also discharge the respective liquid bodies in the same manner as the heads R1 and R2. That is, the head unit 9 is adapted to be capable of discharging three different kinds of liquid bodies.

Each of the droplet discharge heads 50 includes a nozzle line 52a that is composed of a plurality (180 pieces) of nozzles 52 arranged at a predetermined nozzle pitch P. Accordingly, each of the droplet discharge heads 50 has a discharge width of a length of L. The heads R1 and R2 are arranged in parallel in the main scan direction so that the nozzle lines 52a adjacent when viewed from the main scan direction (the X direction) are continued with a nozzle pitch P therebetween in the sub scan direction (the Y direction) which is orthogonal to the main scan direction. Accordingly, the heads R1 and R2 have the discharge width of a length of 2 L.

As described above, the head unit 9 can rotate around the rotating axis L shown in FIG. 1 on the XY plane due to the head unit rotating mechanism 70. That is, the head plate 9a can rotate around a point 1, through which the rotating axis L penetrates through the head plate 9a, on the XY plane as shown in FIG. 3. The point 1 is positioned on the nearly center of the head plate 9a.

While the head 50 has one row of the nozzle line 52a in the embodiment, the number of nozzle lines is not limited to this. The droplet discharge head 50 may have a plurality of the nozzle lines 52a that are arranged with a certain interval in the X direction and shifted by a half of the nozzle pitch P (P/2) in the Y direction. As a result, the nozzle pitch P substantively becomes narrower, and the droplets D can be discharged with high fineness.

Control System of Liquid Body Discharge Device

Figure 4:
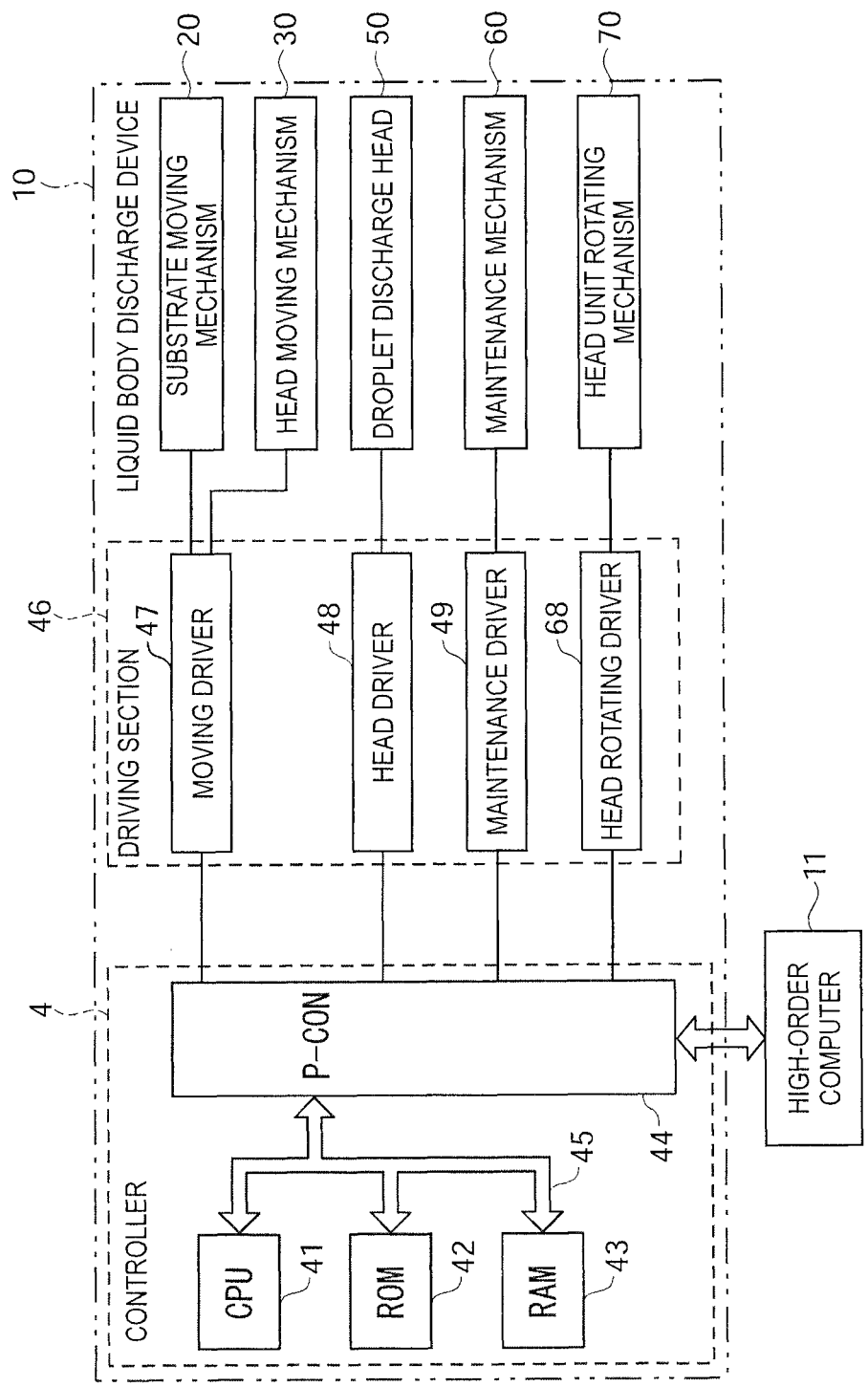
FIG. 4 is a block diagram showing a control system of the liquid body discharge device.

Next, a control system of the liquid body discharge device 10 is described with reference to FIG. 4. FIG. 4 is a block diagram showing the control system of the droplet discharging device.

As shown in FIG. 4, the control system of the liquid body discharge device 10 includes: a driving section 46 having various kinds of drivers for driving the droplet discharge heads 50, the substrate moving mechanism 20, the head moving mechanism 30, and the like; and a controller 4 that controls the liquid body discharge device 10 as well as the driving section 46. The driving section 46 includes: a moving driver 47 performing drive-control of each linear motor of the substrate moving mechanism 20 and the head moving mechanism 30; a head driver 48 performing discharge-control of the droplet discharge heads 50; a head rotating driver 68 controlling the head unit rotating mechanism 70 which rotates the head unit 9; a maintenance driver 49 performing drive-control of each maintenance unit of the maintenance mechanism 60; and a discharge amount measurement driver (not shown) controlling the discharge amount measurement mechanism.

The controller 4 includes a CPU 41, a ROM 42, a RAM 43, and a P-CON 44, which are coupled to each other through a bus 45. To the P-CON 44, a high-order computer 11 is coupled. The ROM 42 has a control program region for storing a control program and the like to be processed by the CPU 41 and a control data region for storing control data and the like to be used to perform a drawing operation, function recovery processing, and the like.

The RAM 43 has various kinds of storage sections such as a pattern data storage section storing pattern data to be used to draw patterns on the substrate B, and is used as various kinds of work regions for control processing. The P-CON 44 is coupled with the various drivers and the like of the driving section 46, and has a logic circuit to cover the functions of the CPU 41 as well as to handle interface signals between the CPU 41 and peripheral circuits. Therefore, the P-CON 44 takes various kinds of commands from the high-order computer 11 into the bus 45 directly or after processing them, and outputs data and control signals, which are outputted from the CPU 41 and the like to the bus 45, to the driving section 46 directly or after processing them in conjunction with the CPU 41.

The CPU 41 controls the liquid body discharge device 10 as a whole in the following manner. The CPU 41 inputs various kinds of detection signals, various kinds of commands, various kinds of data, and the like through the P-CON 44 in accordance with the control program in the ROM 42, and processes the various kinds of data and the like in the RAM 43. Thereafter, the CPU 41 outputs various kinds of control signals to the driving section 46 and the like through the P-CON 44. For example, the CPU 41 controls the droplet discharge heads 50, the substrate moving mechanism 20, and the head moving mechanism 30 so as to dispose the head unit 9 and the substrate B opposite to each other. Then, in synchronization with a relative movement of the head unit 9 and the substrate B, the liquid body is discharged as the droplets D from the predetermined number of the nozzles 52 of each of the droplet discharge heads 50 provided to the head unit 9 so as to form a pattern on the substrate B.

Here, discharging the liquid body in synchronization with the movement of the substrate B in the X direction is referred to as a main scan, whereas moving the head unit 9 in the Y direction is referred to as a sub scan. The liquid body discharge device 10 of the embodiment can discharge the liquid body by repeating combination of the main scan and the sub scan a plurality of times. The main scan is not limited to the movement of the substrate B in a single direction with respect to the droplet discharge heads 50. It may also be performed by reciprocating the substrate B.

The high-order computer 11 can not only send control information such as control programs and control data to the liquid body discharge device 10 but also modify the control information. The high-order computer 11 also has a function as an arrangement information producing section that produces arrangement information for arranging droplets D of a liquid body in a necessary amount for every discharged region of the substrate B based on positional information of the nozzles 52. The arrangement information, which is represented, for example, as a bitmap, includes: a classification of the nozzle 52 to discharge droplets and the nozzle 52 to be in a waiting state and a discharge position of the droplet D in a discharged region (in other words, a relative position of the substrate B and the nozzle 52); the arrangement number of droplets D (in other words, the number of discharges and a discharge ratio in every nozzle 52); and an on/off, discharge timing, and the like of the plurality of the nozzles 52 in the main scan.

Method for Discharging Liquid Body and Method for Manufacturing Color Filter

Figure 5A:
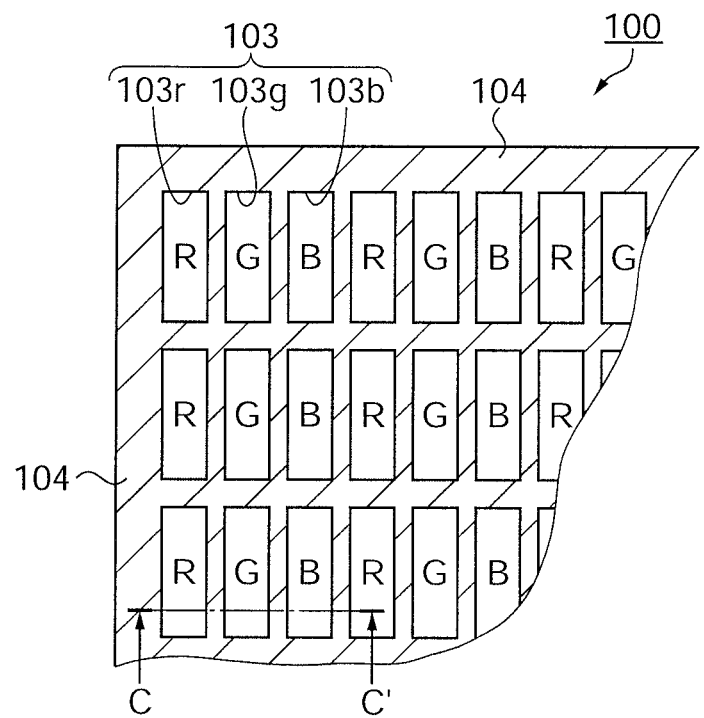
FIGS. 5A and 5B are schematic views showing a color filter.
Figure 5B:
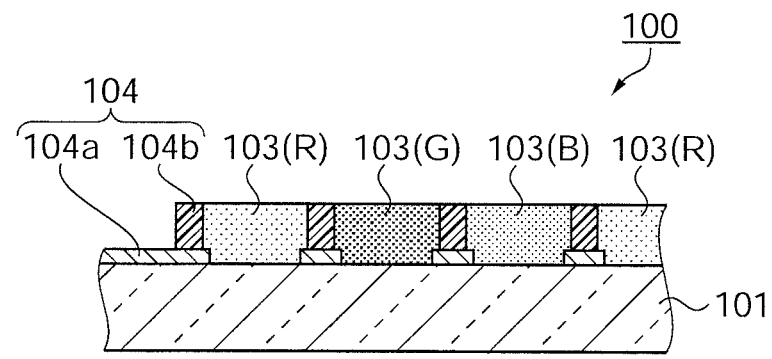
Figure 6:
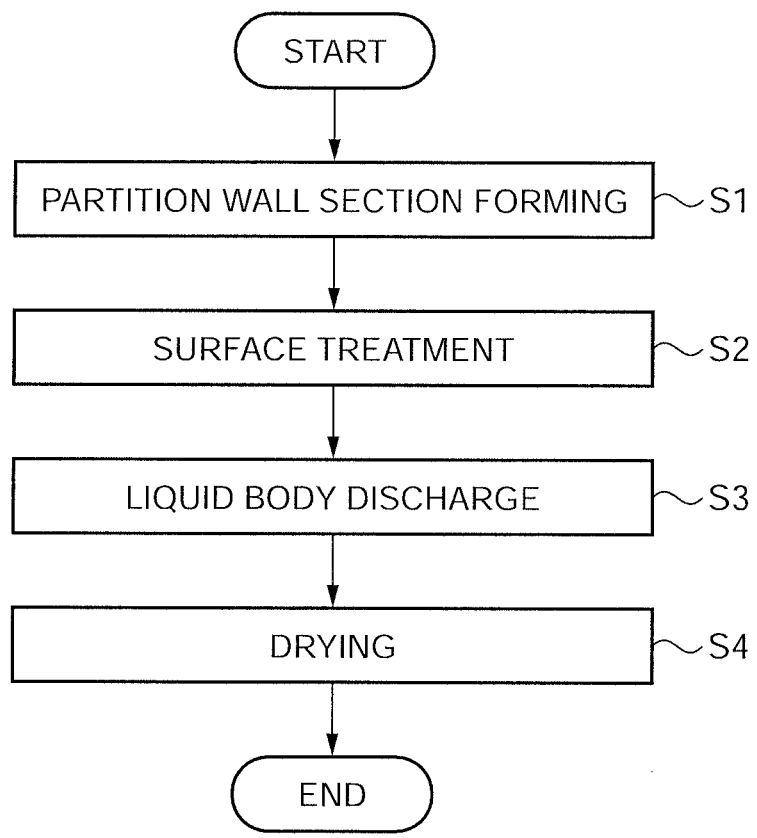
FIG. 6 is a flowchart showing a method for manufacturing a color filter.

A method for manufacturing a color filter employing a method for discharging a liquid body of the embodiment is described with reference to FIGS. 5A to 9B. FIG. 5A is a plan view schematically showing a color filter, and FIG. 5B is a sectional view taken along the line C-C' of FIG. 5A. FIG. 6 is a flow chart showing the method for manufacturing a color filter. FIGS. 7A to 7D are sectional views schematically showing the method for manufacturing a color filter.

As shown in FIGS. 5A and 5B, a color filter 100 has colored layers 103, which are filter elements of three colors of red (R), green (G), and blue (B), on a substrate 101 made of transparent glass or the like. The colored layers 103 are formed in film forming regions 103r, 103g, and 103b serving as regions to which a liquid body is discharged (hereinafter, referred to as a discharged region). The regions 103r, 103g, and 103b have a rectangular shape and are defined by a partition wall section 104 in a matrix. The color filter 100 of the embodiment is what is called a color filter of a stripe type. In the color filter 100, the colored layers 103 of each color are arranged in a linear manner.

As shown in FIG. 5B, the partition wall section 104 has a two-layer structure composed of a first partition wall section 104a and a second partition wall section 104b. The first partition wall section 104a is, for example, a thin film made of metal such as Cr and Al, and has a light shielding property. The second partition wall section 104b is made of a resin material, for example. The structure is not limited to the two-layer structure, but may be a single-layer structure in which the partition wall section 104 is made of a resin material containing a component having a light shielding property.

The colored layer 103 is made of a transparent resin material containing a coloring material. In the embodiment, such the color filter 100 is manufactured by using the liquid body discharge device 10.

As shown in FIG. 6, the method for manufacturing the color filter 100 of the embodiment basically includes the following 4 steps: a partition wall section forming step (step S1) to form the partition wall section 104; a surface treatment step (step S2) to perform a surface treatment on the surface of the substrate 101 on which the partition wall section 104 has been formed; a liquid body discharge step (step S3) to discharge a liquid body containing a colored layer forming material; and a drying step (step S4) to dry the discharged liquid body to form the colored layers 103.

Figure 7A:
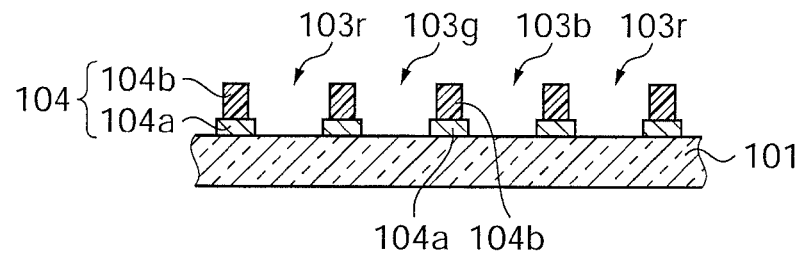
FIGS. 7A to 7D are schematic sectional views showing the method for manufacturing a color filter.

In the step S1 of FIG. 6, a metal thin film made of Cr, Al, or the like is first formed on the surface of the substrate 101. The metal thin film is formed by vacuum vapor deposition, sputtering, or the like. The metal thin film is formed, for example, with a thickness of about 0.1 µm so as to have a light shielding property. The metal thin film is patterned by photolithography to form the first partition wall section 104a defining opening regions as shown in FIG. 7A. Then, a photosensitive resin is applied with a thickness of about 2 µm to cover the first partition wall section 104a. The resin is patterned by photolithography to form the second partition wall section 104b on the first partition wall section 104a. As a result, the film forming regions 103r, 103g, and 103b are formed on the substrate 101 as the opening regions each having a rectangular shape as shown in FIG. 7A. Then, the process goes to the step S2.

In the step S2 of FIG. 6, a lyophilic treatment is performed on the surface of the substrate 101 so that the discharged liquid body land on, and then wet and spread in the film forming regions 103r, 103g, and 103b in the liquid body discharge step, which is described later. In addition, a lyophobic treatment is performed on at least the upper surface portion of the second partition wall section 104b so that part of the discharged liquid body landed on the second partition wall section 104b flows in the film forming regions 103r, 103g, and 103b.

As for the surface treatment, a plasma treatment with $O_2$ used as a processing gas and a plasma treatment with a fluoric gas used as a processing gas are carried out on the substrate 101 on which the partition section 104 has been formed. That is, the film forming regions 103r, 103g, and 103b are subjected to the lyophilic treatment, and then the upper surface of the second partition wall section 104b made of a photosensitive resin is subjected to the lyophobic treatment. If the second partition wall section 104b is made of a material having lyophobicity, the latter treatment can be omitted. Then, the process goes to the step S3.

Figure 7B:
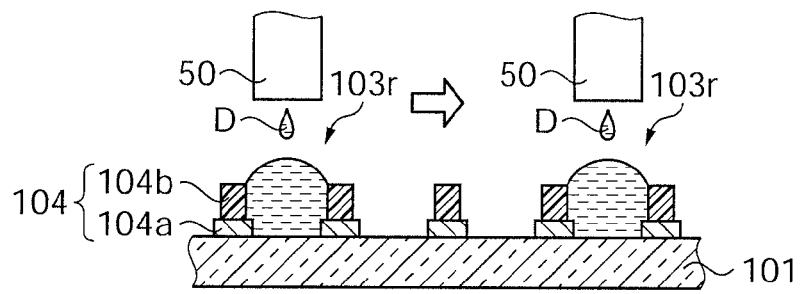
Figure 7C:
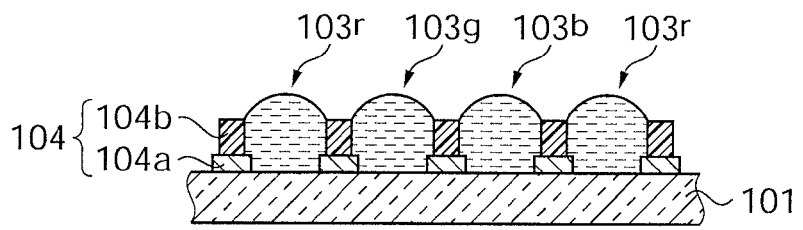

In the step S3 of FIG. 6, the substrate 101 on which surface treatment has been performed is placed on the stage 5 of the droplet discharge device 10 which is shown in FIG. 1. Then, liquid bodies of three colors respectively containing different colored layer forming materials are discharged from the droplet discharge heads 50 of the head unit 9 shown in FIG. 3. Specifically, as shown in FIGS. 7B and 7C, the liquid bodies of the three colors are discharged from the nozzles 52 of the droplets discharge heads 50 as the droplets D to the respective desired film forming regions 103r, 103g, and 103b in synchronization with the relative movement of the substrate 101 and the droplet discharge heads 50 in the main scan direction. The discharge amounts of the liquid bodies discharged to the film forming regions 103r, 103g, and 103b are controlled by proper control signals sent from the CPU 41 of the controller 4 to the head driver 48. The CPU 41 sends the signals based on discharge data that sets in advance, for the every main scan, a selection pattern of the nozzles 52 that are selected for each of the film forming regions 103r, 103g, and 103b, the discharge number of the droplets D, and the like. As a result, the liquid bodies each having a desired amount are discharged to the respective film forming regions 103r, 103g, and 103b. Then, the process goes to the step S4.

Figure 7D:
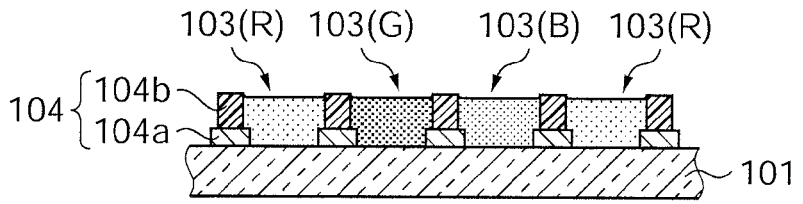

In the step S4 of FIG. 6, as shown in FIG. 7D, the solvent components are evaporated from the liquid bodies discharged on the substrate 101 so as to form the colored layers 103 made of the colored layer forming materials. In the embodiment, the substrate 101 is placed and reduced-pressure dried, in a reduced-pressure drying device capable of performing a drying treatment while maintaining steam pressure of the solvent constant, so as to form the colored layers 103 of three colors of R, G, and B. In this regard, the colored layer 103 may be formed by repeating a step of discharging the liquid body of one of the colors and drying it three times. In the step S3, the colored layers 103 may have different film thickness in every color, and do not necessarily have a single thickness for the three colors. The liquid bodies may be discharged to the respective film forming regions 103r, 103g, and 103b with corresponding amounts based on the required film thicknesses.

The size of the substrate 101, on which the color filter 100 is formed, depends on the size of a display device using the substrate 101. Even if display devices have the same size as each other, one having pixels arranged at a high density requires the color filter 100 to arrange the colored layers 103 at a high density.

As a method for producing the color filter 100 more efficiently, in general, a plurality of color filters are arranged on a mother substrate B having an area larger than that of the substrate 101. The size of the mother substrate B dominates the size, which is efficient from an area point of view, of the color filter 100. If color filters 100, which have sizes inefficient from the area point of view, are arranged in the mother substrate B, disadvantageously producing empty spaces in the mother substrate B. It can be useful that a color filter 100 having a different size is arranged in the empty space so as to use the mother substrate B without any wastes.

In a case where the color filters 100 having different sizes are arranged on the mother substrate B, arranging directions of the film forming regions 103r, 103g, and 103b, that is, directions in stripes may be orthogonal to each other. As described above, the arrangement of droplets in the film forming regions 103r, 103g, and 103b are realized by discharging the liquid body at discharge timing in the main scan. The plurality of nozzles 52 viewed from the main scan direction are arranged at a constant nozzle pitch P as described above. When the arrangement directions of the film forming regions 103r, 103g, and 103b each having a rectangular shape are different on the mother substrate B, the number of nozzles 52 facing the film forming regions 103r, 103g, and 103b may be limited depending on the arrangement directions.

The method for manufacturing the color filter 100 by using the method for discharging a liquid body of the embodiment provides a preferable method for discharging a liquid body based on the arrangements of the film forming regions 103r, 103g, and 103b on the mother substrate B. The details are described in the following examples.

First Example

Figure 8:
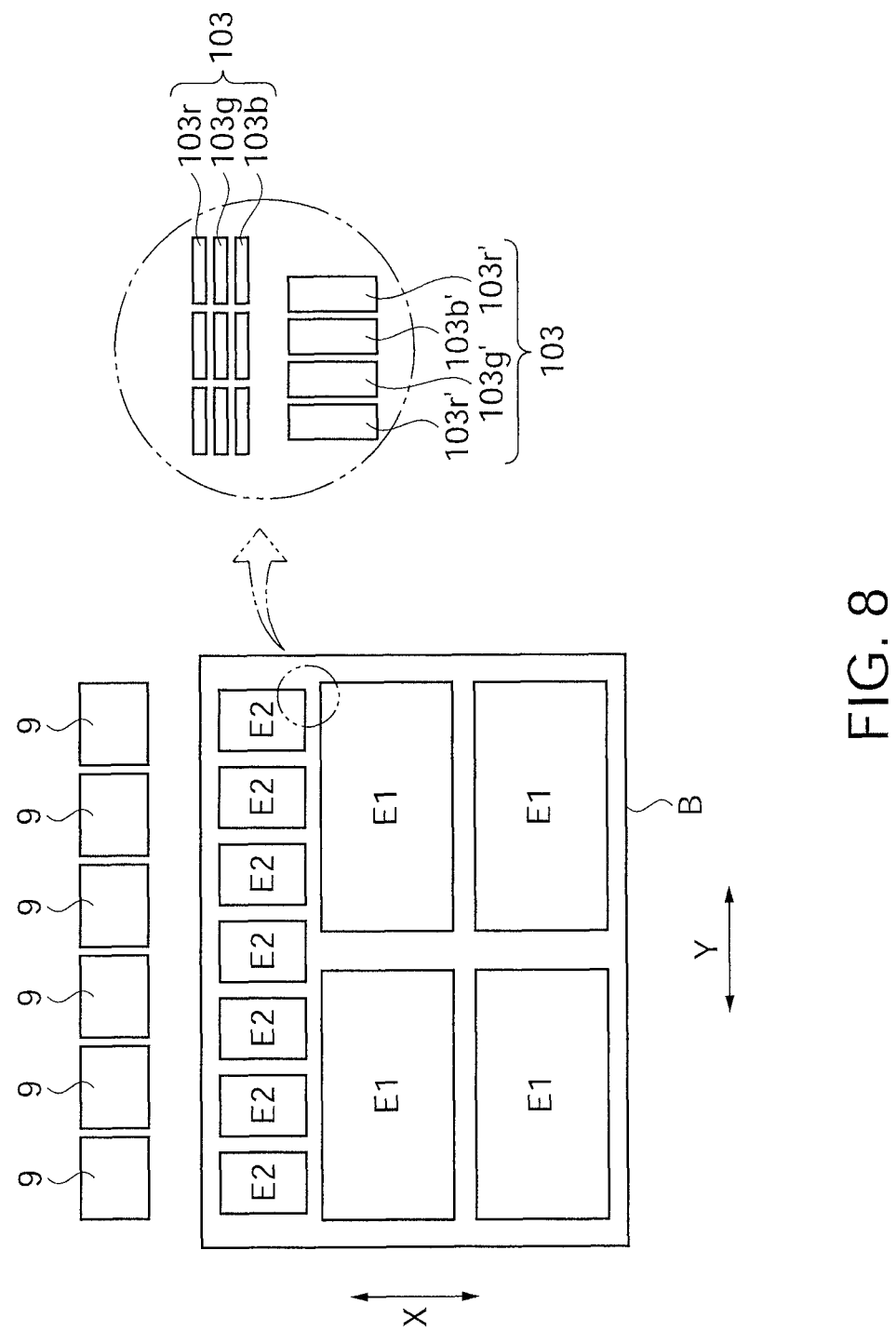
FIG. 8 is a schematic plan view showing a relative arrangement of the head unit and a mother substrate.
Figure 9A:
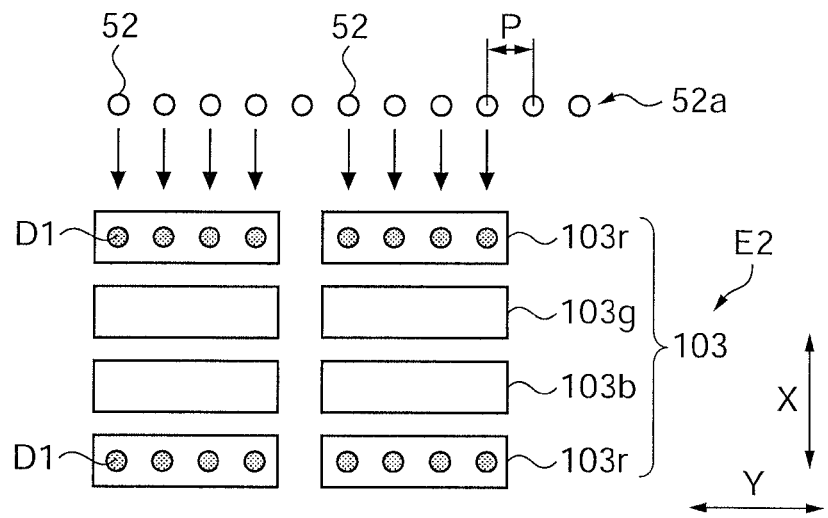
FIGS. 9A and 9B are schematic plan views showing an arrangement of droplets in a discharging step of the liquid body.
Figure 9B:
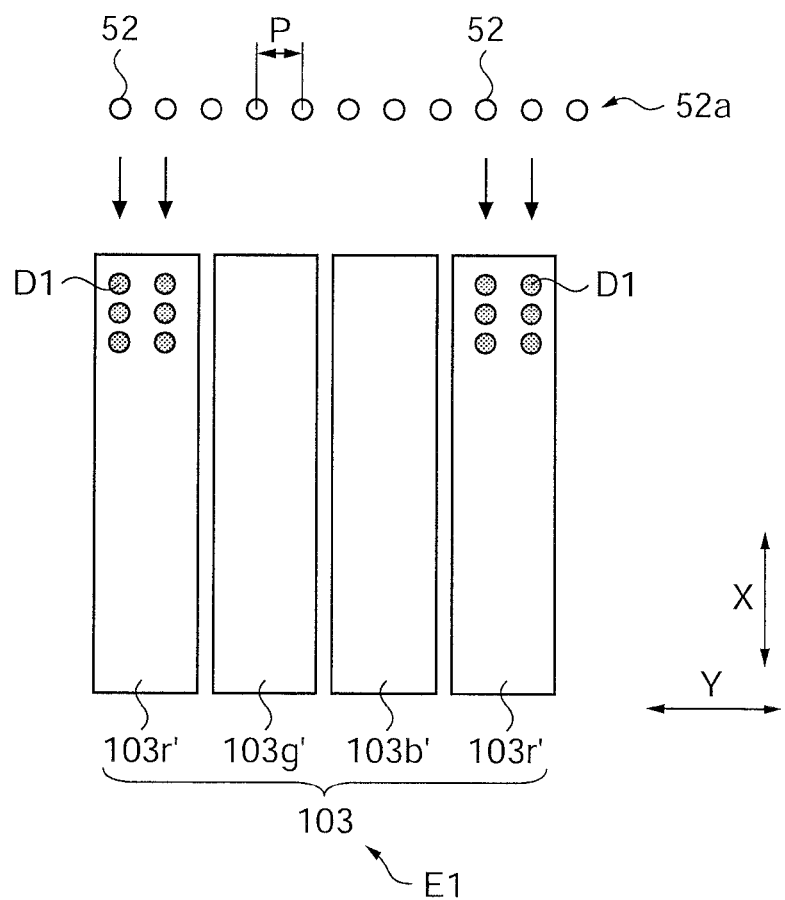

A method for manufacturing a color filter of a first example is described with reference to FIG. 8 to FIG. 9B. FIG. 8 is a schematic plan view showing a relative arrangement between the head unit and the mother substrate in the liquid body discharge step. FIGS. 9A and 9B are schematic plan views showing an arrangement of droplets in the liquid body discharge step. The X direction and the Y direction shown in FIG. 8 to FIG. 9B respectively indicate the same direction as the X direction and the Y direction in FIG. 1.

As shown in FIG. 8, a mother substrate B of the first example has second panels E2 arranged in a plural manner (seven) along a long side of the mother substrate B, and first panels E1 arranged in a matrix (four) along the long side and a short side of the mother substrate B. The second panel E2 has an area smaller than that of the first panel E1.

In the second panels E2, the film forming regions 103r, 103g, and 103b, each having a rectangular shape and serving as the second discharged region, are arranged in plural number in a matrix. Likewise, in the first panels E2, the film forming regions 103r', 103g', and 103b', each having a rectangular shape and serving as the first discharged region, are arranged in plural number in a matrix. Here, the area of the film forming region 103r is smaller than that of the film forming region 103r'. In the same manner, the areas of the film forming regions of 103g and 103b are respectively smaller than those of the film forming regions 103g' and 103b'. The film forming region 103r and the film forming region 103r' are arranged in an orthogonal stripe direction in which the liquid body of the same kind (same color) is discharged. In the same manner, the film forming regions 103g and 103b and the film forming regions 103g' and 103b' are arranged in the orthogonal stripe directions of the respective colors. Desired liquid bodies are discharged to respective film forming regions at predetermined amounts to form the colored layers 103.

In the liquid body discharge step using the liquid body discharge device 10 shown in FIG. 1, the mother substrate B is positioned on the stage 5 so that the long side of the mother substrate B is approximately in parallel with the head units 9 arranged in the head moving mechanism 30 in the sub scan direction (Y direction). Then, liquid bodies are discharged from droplet discharge heads 50 provided to the head unit 9 to the mother substrate B while the stage 5 moves in the main scan direction (X direction).

In this case, the long side direction of the film forming regions 103r, 103g, and 103b corresponds to the sub scan direction (Y direction). The long side direction of the film forming regions 103r', 103g', and 103b' corresponds to the main scan direction (X direction). The nozzle line 52a formed on the droplet discharge head 50 is disposed so as to correspond to the sub scan direction (Y direction) by the head unit rotating mechanism 70. Accordingly, the nozzle line 52a composed of the plurality of nozzles 52 is disposed in the long side direction of the film forming regions 103r, 103g, and 103b each having a rectangular shape, as shown in FIG. 9A.

For example, in the main scan direction (X direction), four nozzles 52 are allocated to the film forming region 103r, to which a red liquid body is to be discharged, and a droplet D1 is discharged from each of the nozzles 52 to the region 103r. Thus, four droplets D1 are applied to the film forming region 103r. The landed droplets D1 wet and spread in the film forming region 103r. In the main scan direction, the droplet D1 can be landed on an arbitrary position in the film forming region 103r by controlling discharge timing. In the sub scan direction (Y direction), landed positions may differ in each of the film forming regions 103r because of a relation between the arrangement pitch of the film forming regions 103r in the sub scan direction and the nozzle pitch P. As is the case with the film forming region 103r, the desired liquid bodies are respectively discharged as four droplets D1 in each of the film forming regions 103g and 103b in the second panel E2.

As shown in FIG. 9B, in the main scan, for example, two nozzles 52 are allocated to the film forming region 103r' having an area larger than that of the film forming region 103r and arranged orthogonal to the region 103r. A plurality of droplets D1 are discharged in the main scan direction from each of the nozzles 52. Thus, the droplets D1 are applied to each film forming region 103r'. In the main scan direction, the droplet D1 can be landed on an arbitrary position in the film forming region 103r' by controlling discharge timing. In the sub scan direction (Y direction), even though two nozzles 52 are allocated to each of the film forming regions 103r', landed positions may differ in each of the film forming regions 103r' because of a relation between the arrangement pitch of the film forming regions 103r' in the sub scan direction and the nozzle pitch P. As is the case with the film forming region 103r', the desired liquid bodies are discharged as droplets D1 respectively in the film forming regions 103g' and 103b' in the first panel E1.

As described above, in the discharge step of the first example, the head unit 9 and the mother substrate B are positioned so as to allocate more number of nozzles 52 to the film forming regions 103r, 103g, and 103b having smaller areas than the film forming regions 103r', 103g', and 103b', and thus the droplets D1 can be discharged to each of the film forming regions 103r, 103g, and 103b and each of the film forming regions 103r', 103g', and 103b'.

Advantageous effects of the first example are described below.

(1) According to the method for discharging a liquid body of the first example, the nozzle line 52a can be arranged in the same direction as a direction of the short side of the film forming regions 103r', 103g', and 103b' serving as the first discharged regions and having large areas, and as a direction of the long side of the film forming regions 103r, 103g, and 103b serving as the second discharged regions and having small areas. That is, the nozzles 52 can be arranged in the direction of the short side of the film forming regions 103r', 103g', and 103b' having the large areas and in the direction of the long side of the film forming regions 103r, 103g, and 103b having the small areas. Therefore, even if the first discharged regions and the second discharged regions having different areas from those of the first discharged regions are arranged on a single substrate in a mixed manner, more number of nozzles which can discharge the liquid body in each of the discharged regions can be allocated. This reduces concentrated discharge of the liquid body to a certain part in the discharged region and resulting imbalance of the discharge amount of the liquid body. Consequently, unevenness of thickness of a thin film formed in the discharged region can be reduced.

(2) According to the method for discharging a liquid body of the first example, unevenness between thicknesses of the colored layers 103 formed in the film forming regions 103r', 103g', and 103b' and those of the layers 103 formed in the film forming regions 103r, 103g, and 103b that are arranged orthogonal to the regions 103r', 103g', and 103b' and have different areas from those of the regions 103r', 103g', and 103b' can be reduced. That is, at least two kinds of color filters 100 having different arrangement directions of the colored layers 103 and having different sizes can be manufactured with high productivity.

Second Example

A method for manufacturing a color filter of a second example is described with reference to FIG. 10 to FIG. 11B.

Figure 10:
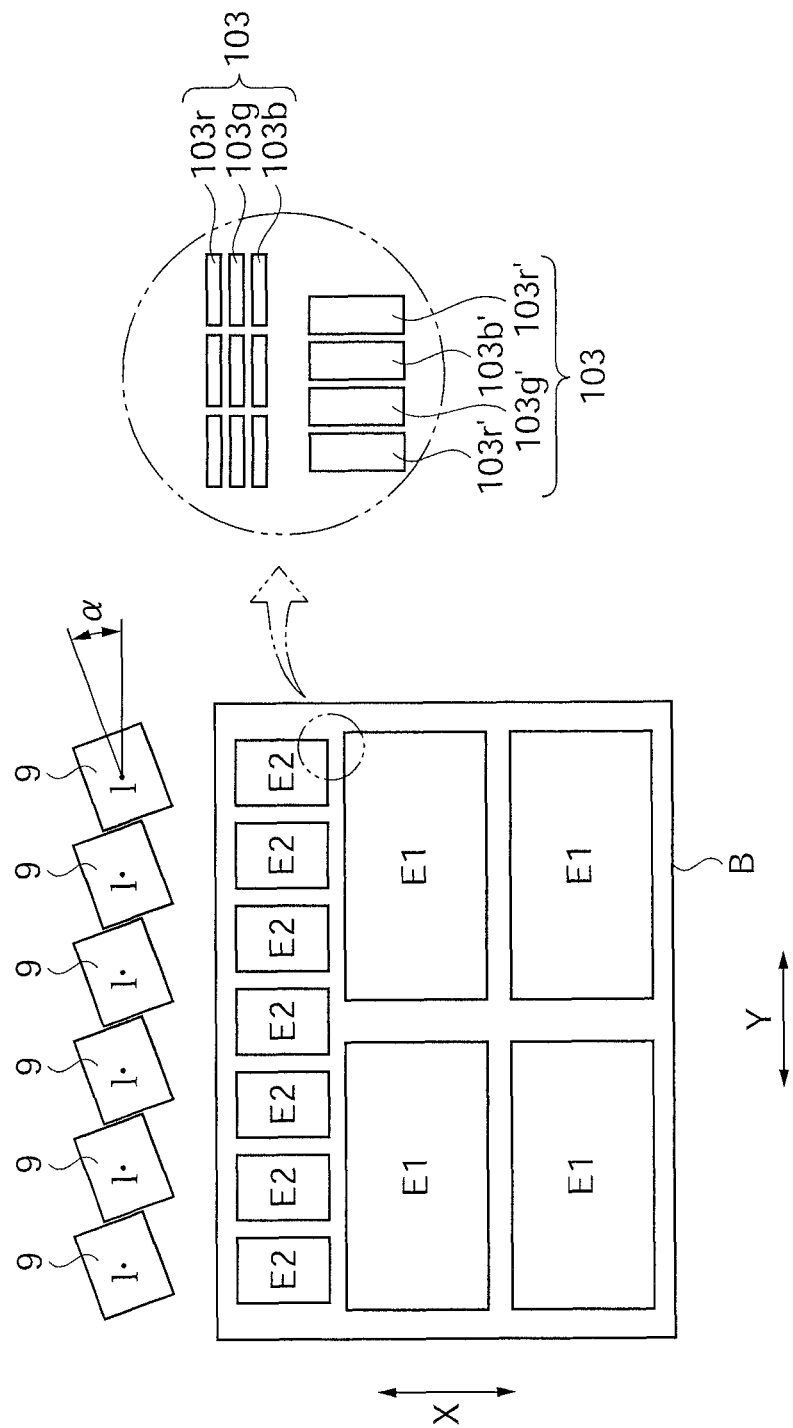
FIG. 10 is a schematic plan view showing a relative arrangement of the head unit and the mother substrate in a second example.
Figure 11A:
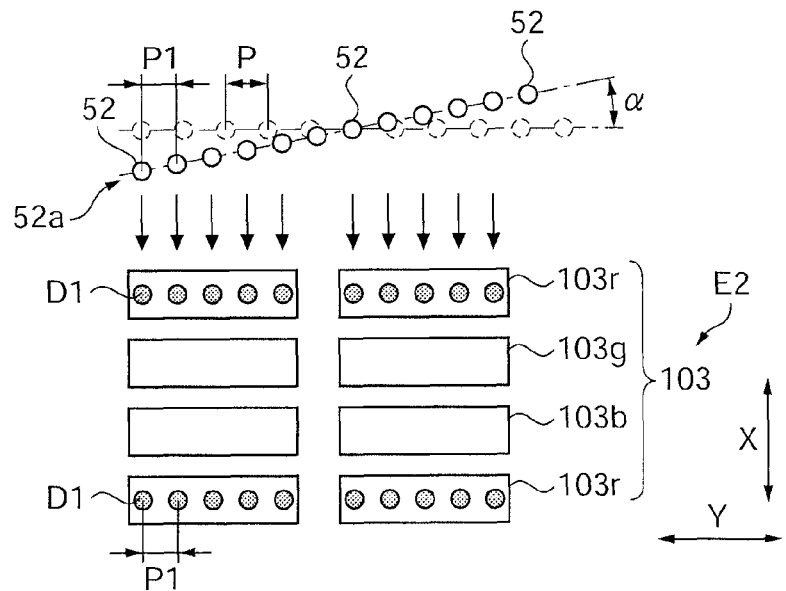
FIGS. 11A and 11B are schematic plan views showing an arrangement of droplets in the second example.

FIG. 10 is a schematic plan view showing a relative arrangement between a head unit and a mother substrate in the liquid body discharge step in the second example. FIGS. 11A and 11B are schematic plan views showing an arrangement of droplets in the liquid body discharge step of the second example. The X direction and the Y direction shown in FIG. 10 to FIG. 11B respectively indicate the same direction as the X direction and the Y direction in FIG. 1. The same numeral is given to the same structure as the first example employs, and the description thereof is omitted.

The mother substrate of the second example has seven plates of second panels E2 and four plates of first panels E1 as is the case with the first example. A plurality of film forming regions 103r, 103g, and 103b serving as the second discharged regions and having rectangular shapes are arranged in a matrix in the second panels E2, and a plurality of film forming regions 103r', 103g', and 103b' serving as the first discharged regions and having rectangular shapes are arranged in a matrix in the first panels E1.

In the liquid body discharge step using the liquid body discharge device 10 shown in FIG. 1, the mother substrate B is positioned on the stage 5 so that the long side of the mother substrate B is approximately in parallel with the plurality of head units 9 arranged in the sub scan direction (Y direction) on the head moving mechanism 30. In the second example, the head units 9 are rotated by α degrees with respect to the Y direction around the point 1 by using the head unit rotating mechanism 70, as shown in FIG. 10. As a result, the nozzle line 52a formed on the droplet discharge head 50 is also disposed in a rotated manner by α degrees.

Accordingly, the nozzle line 52a composed of the plurality of nozzles 52 is disposed to make the angle of α degrees with the direction of the long side of the film forming regions 103r, 103g, and 103b each having a rectangular shape, as shown in FIG. 11A. The droplet discharge heads 50 provided to the head unit 9 discharge liquid bodies to the mother substrate B while the stage 5 moves in the main scan direction (X direction). In this case, the nozzle line 52a is disposed to make the angle of α degrees with the Y direction, so that an arranging pitch P1 (P×Cos α) of substantive droplets on the film forming region 103r is smaller than the nozzle pitch P of the nozzle line 52a.

In the main scan direction (X direction), five nozzles 52 are allocated to the film forming region 103r, to which a red liquid body is to be discharged, and a droplet D1 is discharged from each of the nozzles 52 to the region 103r. Thus, five droplets D1 are applied to each film forming region 103r. In the main scan direction, the droplet D1 can be landed on an arbitrary position in the film forming region 103r by controlling discharge timing. That is, droplets can be arranged on arbitrary positions, in the X direction, of the film forming region 103r in a linear manner. As is the case with the film forming region 103r, the desired liquid bodies are respectively discharged as five droplets D1 in each of the film forming regions 103g and 103b in the second panel E2.

Figure 11B:
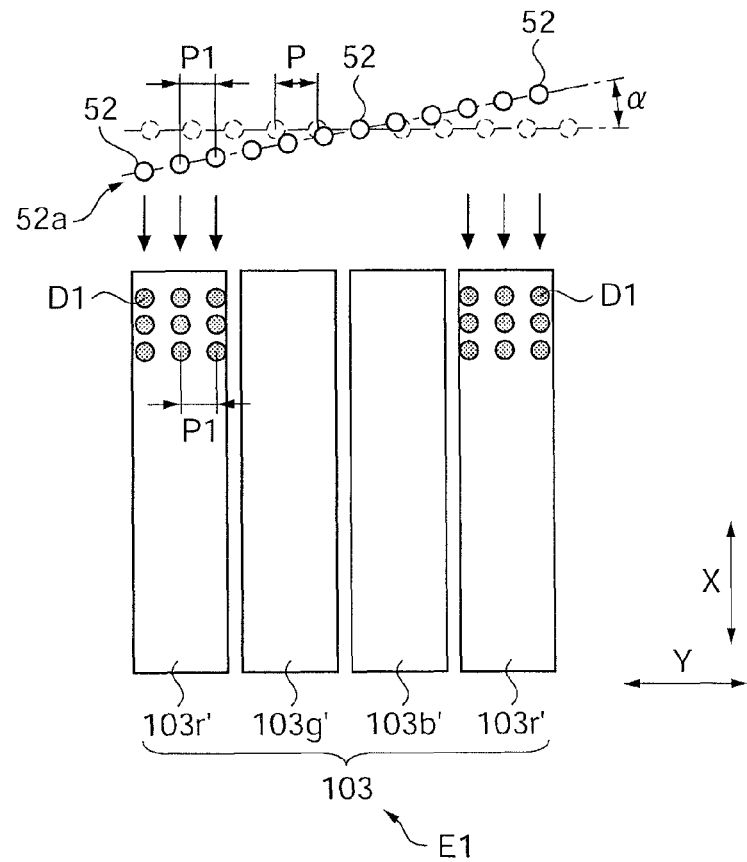

As shown in FIG. 11B, the nozzle line 52a is disposed to make the angle of α degrees with the Y direction, so that an arranging pitch P1 (P×Cos α) of substantive droplets on the film forming region 103r', which has a larger area than the film forming region 103r and disposed orthogonal to the region 103r, is smaller than the nozzle pitch P of the nozzle line 52a. Accordingly, three nozzles 52 are allocated to the film forming region 103r'. A droplet D1 is discharged from each of the nozzles 52. Thus, three droplets D1 are applied to each of the film forming regions 103r' in the sub scan direction. In the main scan direction, the droplet D1 can be landed on an arbitrary position in the film forming region 103r' by controlling discharge timing. As is the case with the film forming region 103r', the desired liquid bodies are discharged as droplets D1 respectively in the film forming regions 103g' and 103b' in the first panel E1.

Advantageous effects of the second example are described below.

(1) According to the method for discharging a liquid body of the second example, the arranging pitch P1 of droplets arranged in the direction of the short side of the film forming regions 103r', 103g', and 103b' can be substantively set to be smaller than the nozzle pitch P by disposing the nozzle line 52a to make the angle of α degrees with the direction of the short side of the film forming regions 103r', 103g', and 103b' serving as the first discharged regions. Namely, the liquid body can be discharged to the film forming regions 103r', 103g', and 103b' from more number of nozzles 52. This reduces concentrated discharge of the liquid body to a certain part in the discharged region and resulting imbalance of the discharge amount of the liquid body. Consequently, unevenness of thickness of a thin film formed in the discharged region can be reduced.

(2) According to the method for discharging a liquid body of the second example, more number of nozzles 52 can be disposed to face the discharged region and discharge the liquid body to the region. Therefore, even if a discharge property varies in the nozzles 52, the variation of the discharge property can be dispersed by using more number of nozzles 52. Consequently, unevenness of thickness of a thin film formed in the discharged region can be reduced.

(3) According to the method of the second example, the arranging pitch P1 of droplets landed on the discharged region can be arbitrarily set, regardless of the nozzle pitch P, by adjusting the rotating angle α of the head unit 9. Accordingly, the liquid body can be discharged as droplets from a multitude of nozzles 52 regardless of the size of the discharged region in the sub scan direction. This reduces concentrated discharge of the liquid body to a certain part in the discharged region and resulting imbalance of the discharge amount of the liquid body. Further, even if a discharge property varies in the nozzles 52, the variation of the discharge property can be dispersed by using a plurality of nozzles 52. Consequently, unevenness of thickness of a thin film formed in the discharged region can be reduced.

(4) The arranging pitch P1 of droplets landed on the discharged region can be arbitrarily set, so that the liquid body can be discharged to the discharged region in high density and high definition. Accordingly, a high-density and high-definition thin film can be formed, contributing high image quality of a display device.

(5) According to the method for discharging a liquid body of the second example, the method can reduce unevenness between thicknesses of the colored layers 103 formed in the film forming regions 103r', 103g', and 103b' and those of the layers 103 formed in the film forming regions 103r, 103g, and 103b that are arranged orthogonal to the regions 103r', 103g', and 103b' and have different areas from the regions 103r', 103g', and 103b'. That is, at least two kinds of color filters 100 having different arranging directions of the colored layers 103 and having different sizes can be manufactured with high productivity.

Third Example

Figure 12A:
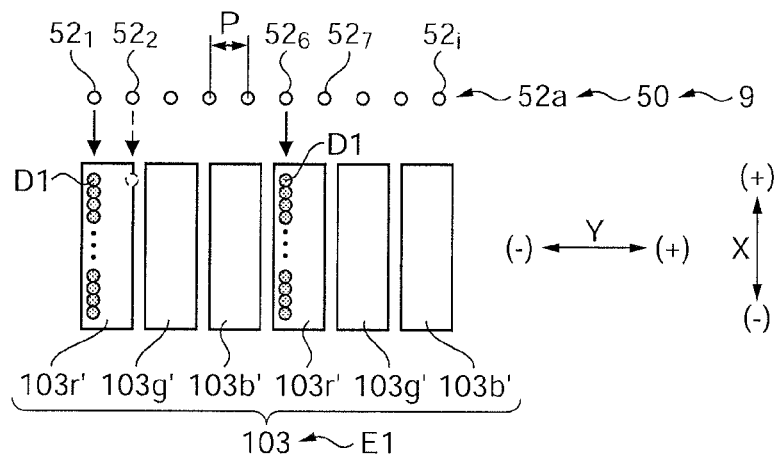
FIGS. 12A to 12C are schematic plan views showing an arrangement of droplets in a third example.
Figure 12B:
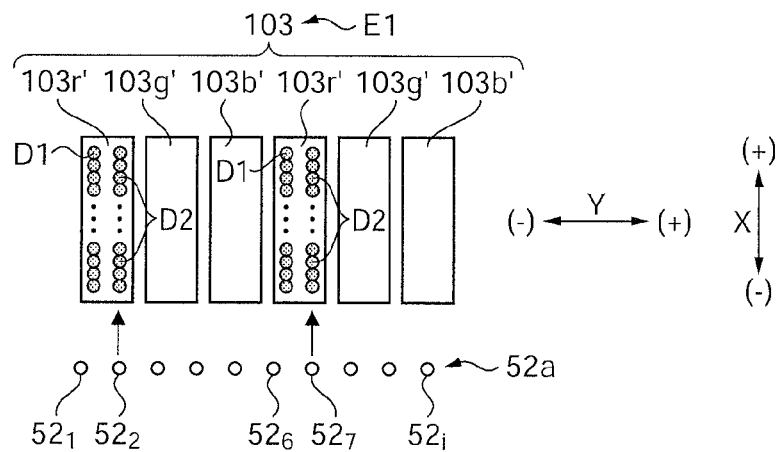
Figure 12C:
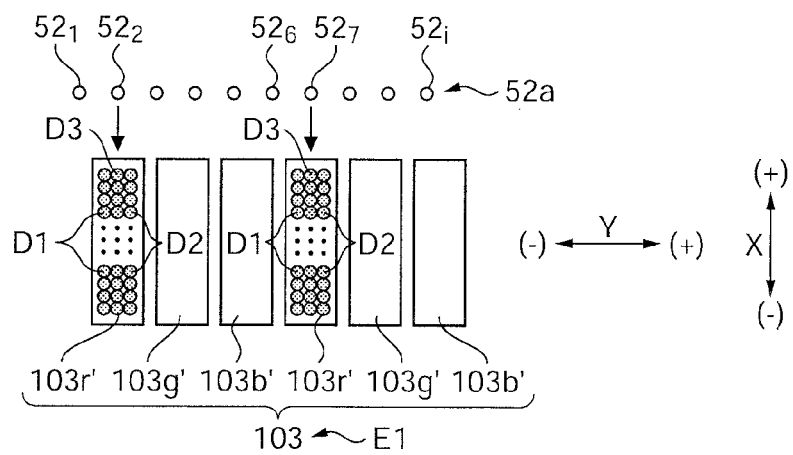

A method for manufacturing a color filter of a third example is described with reference to FIGS. 12A to 12C. FIGS. 12A to 12C are schematic plan views showing an arrangement of droplets in the liquid body discharge step of the third example. The X direction and the Y direction shown in FIGS. 12A to 12C respectively indicate the same direction as the X direction and the Y direction in FIG. 1. The same numerals are given to the same structures as the first and second examples employ, and the description thereof is omitted.

A mother substrate of the third example has seven plates of second panels E2 and four plates of first panels E1 likewise the mother substrate B in the first and second examples. A plurality of film forming regions $103r$, $103g$, and $103b$ serving as the second discharged regions and having rectangular shapes are arranged in a matrix in the second panels E2, and a plurality of film forming regions $103r'$, $103g'$, and $103b'$ serving as the first discharged regions and having rectangular shapes are arranged in a matrix in the first panels E1.

In the liquid body discharge step using the liquid body discharge device 10 shown in FIG. 1, the mother substrate B is positioned on the stage 5 so that the long side of the mother substrate B is approximately in parallel with the plurality of head units 9 arranged in the sub scan direction (Y direction) on the head moving mechanism 30. The stage 5 moves in the main scan direction (X direction) and the droplet discharge heads 50 provided to the head unit 9 discharge liquid bodies to the mother substrate B.

Here, the nozzle line $52a$ of the droplet discharged head 50 provided to the head unit 9 may be disposed to make an angle of α degrees with the sub scan direction or may be disposed in the same direction as the sub scan direction. In the third example, a case where the nozzle line $52a$ is disposed in the same direction as the sub scan direction is exemplified. Further, in the third example, a case where the liquid body is discharged to the film forming regions $103r'$, $103g'$, and $103b'$ as the first discharged regions is described as an example in order to simplify the description.

As shown in FIG. 12A, the nozzle line $52a$ includes a plurality of nozzles $52i$ (i is natural number and i≥1) and is disposed along the direction of the short side of the film forming regions $103r'$, $103g'$, and $103b'$. In the third example, width in the short side direction of the film forming regions $103r'$, $103g'$, and $103b'$ is small. Therefore, a red liquid body is discharged from two nozzles $52_1$ and $52_2$ simultaneously, for example, the red liquid body may be mixed in the film forming region $103g'$ which is adjacent to the region $103r'$. Accordingly, the single nozzle $52_1$ needs to be used for the film forming region $103r'$ to which the red liquid body is to be discharged. Likewise, a single nozzle $52_6$ is used for another film forming region $103r'$ which is one of the regions 103 arranged in a mosaic manner.

When droplets D1 are discharged from the nozzles $52_1$ and $52_6$ while the mother substrate B is moved in the X(+) direction (in FIG. 12A) by the stage 5 which is shown in FIG. 1, namely, when a first-time discharge is performed, the droplets D1 are arranged at the left side, in the drawing, of the film forming $103r'$ in a linear manner, as shown in FIG. 12A. Here, an arranging pitch in the X direction can be arbitrarily adjusted by controlling discharge timing.

Then, the head unit 9 is slightly moved in the Y(−) direction (in FIG. 12B) by the head moving mechanism 30 which is shown in FIG. 1. By adjusting the moving distance, the nozzles $52_2$ and $52_7$ are positioned to face the film forming regions $103r'$ to which the red liquid body is to be discharged, as shown in FIG. 12B. Then, droplets D2 are discharged from the nozzles $52_2$ and $52_7$ while the mother substrate B is moved in the X(−) direction (in FIG. 12C) as a second-time discharge, arranging the droplets D2 at the right side, in the drawing, of the film forming regions $103r'$ in a linear manner.

Thus, the head unit 9 is slightly moved in the Y direction (the sub scan direction) while the mother substrate B is moved in the X direction (the main scan direction) and the liquid body is discharged from the nozzle $52_i$, being able to discharge the liquid body as the droplets D from the nozzle $52_i$ and dispose the droplets on other positions in the Y direction of the film forming region $103r'$.

In a case of adjustment of the discharge amount of the liquid body, or a case of higher-density disposition of the droplets, after the second-time discharge, the head unit 9 is further moved slightly in the Y(−) direction in FIG. 12C by the head moving mechanism 30 which is shown in FIG. 1, setting the nozzles $52_2$ and $52_7$ to face a space between the droplet lines respectively composed of the droplets D1 and the droplets D2. In such state, droplets D3 are discharged from the nozzles $52_2$ and $52_7$ while the mother substrate B is moved in the X(+) direction in FIG. 12C as a third-time discharge. Consequently, three droplet lines which are respectively composed of the droplets D1, the droplets D2, and the droplets D3 are formed on the film forming regions $103r'$.

Advantageous effects of the third example are described below.

(1) According to the method for discharging a liquid body of the third example, the head unit 9 is slightly moved in the Y direction (the sub scan direction) while the mother substrate B is moved in the X direction (the main scan direction) and the liquid body is discharged from the nozzle $52_i$, being able to discharge the liquid body as the droplets D from the nozzle $52_i$ and dispose the droplets on other positions in the Y direction of the film forming region 103. Accordingly, the number of droplets D in the film forming region 103 can be increased substantively. This reduces concentrated discharge of the liquid body to a certain part in the film forming region 103 and resulting imbalance of the discharge amount of the liquid body. Consequently, unevenness of thickness of a thin film formed in the discharged region can be reduced.

(2) According to the method of the third example, the liquid body can be discharged to the film forming region 103 in a manner positioning more number of nozzles $52_i$ opposed to the film forming region 103. Therefore, even if a discharge property varies in the nozzles 52, the variation of the discharge property can be dispersed by using more number of nozzles 52. Consequently, unevenness of thickness of a thin film formed in the film forming region can be reduced.

(3) According to the method of the third example, the arranging pitch of droplets to be landed on the discharged region can be arbitrarily set, regardless of the nozzle pitch P, by adjusting the moving amount of the head unit 9. Accordingly, the liquid body can be discharged as droplets from a multitude of nozzles 52, regardless of the size of the discharged region, in the sub scan direction. This reduces concentrated discharge of the liquid body to a certain part in the discharged region and resulting imbalance of the discharge amount of the liquid body. Further, even if a discharge property varies in the nozzles 52, the variation of the discharge property can be dispersed by using the plurality of nozzles 52. Consequently, unevenness of thickness of a thin film formed in the discharged region can be reduced.

(4) Since the arranging pitch of the droplets to be landed on the discharged region can be arbitrarily set, the liquid body can be discharged to the discharged region in high density and high definition. Accordingly, a high-density and high-definition thin film can be formed, contributing high image quality of a display device.

(5) According to the method for discharging a liquid body of the third example, the method can reduce unevenness between thicknesses of the colored layers 103 formed in the film forming regions 103r', 103g', and 103b' and those of the layers 103 formed in the film forming regions 103r, 103g, and 103b that are arranged orthogonal to the regions 103r', 103g', and 103b' and have different areas from the regions 103r', 103g', and 103b'. That is, at least two kinds of color filters 100 having different arranging directions of the colored layers 103 and having different sizes can be manufactured with high productivity.

Fourth Example

A method for manufacturing an organic EL device will be described. The method uses the method for arranging a liquid body described above.

Organic EL Device

Figure 13:
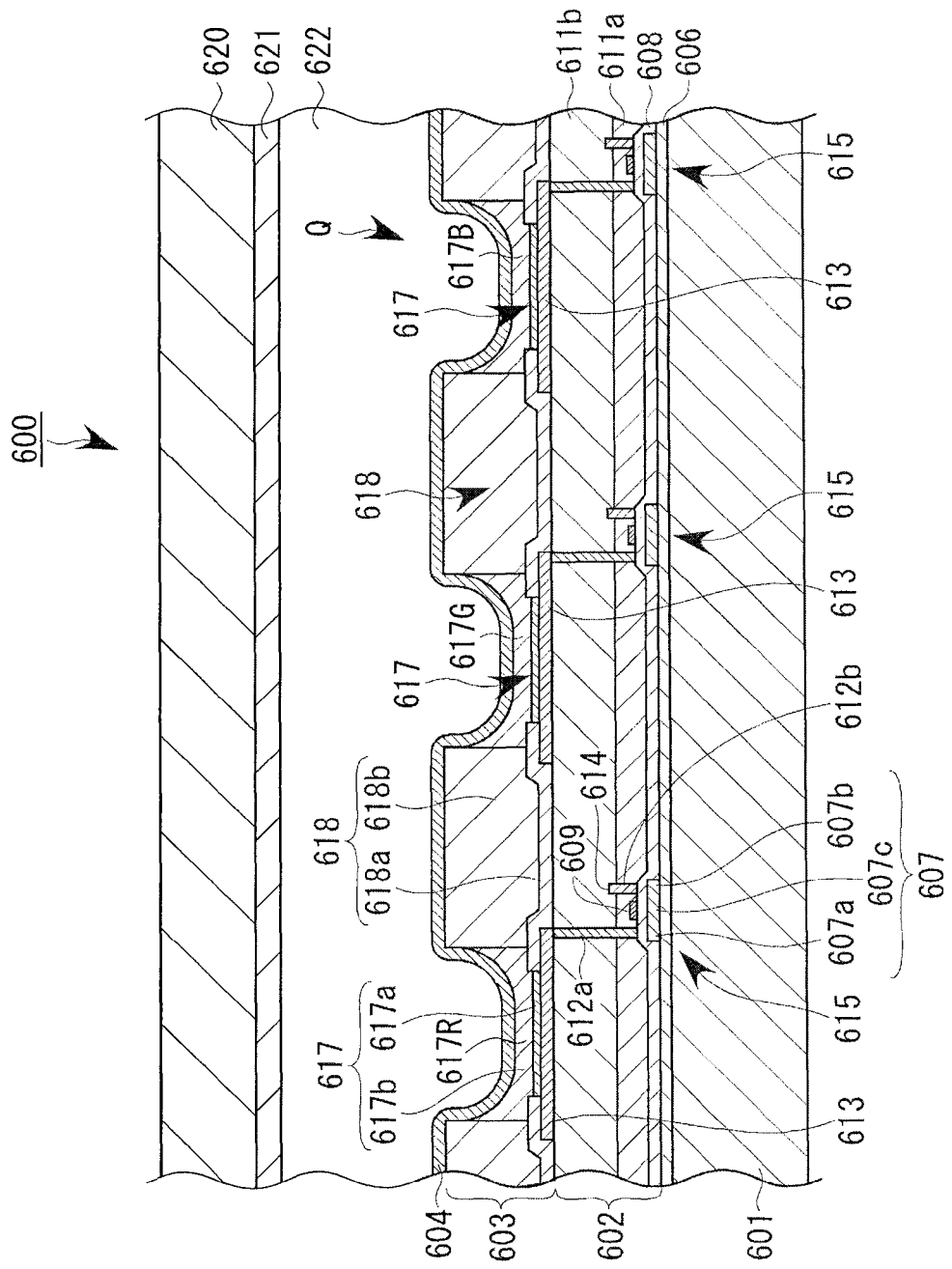
FIG. 13 is a schematic sectional view showing a structure of an essential part of an organic EL device.

FIG. 13 is a sectional view schematically showing a structure of an essential part of an organic EL device. As shown in FIG. 13, an organic EL device 600, which is an electro-optical device, of the embodiment includes an element substrate 601 and a sealing substrate 620. The element substrate 601 includes a light emitting element section 603 serving as an organic EL element. The sealing substrate 620 is bonded to the element substrate 601 in a manner sealing a space 622 therebetween. The element substrate 601 has a circuit element section 602 provided thereon. The light emitting element section 603 is formed on the circuit element section 602 and driven by the circuit element section 602. In the light emitting element section 603, light emitting layers 617R, 617G, and 617B of three colors are formed in discharged regions Q serving as their respective color element regions so as to be arranged in a stripe shape. On the circuit element section 602 of the element substrate 601, picture elements, each of which is composed of three discharged regions Q corresponding to the light emitting layers 617R, 617G, and 617B of three colors, are arranged in a matrix. In the organic EL device 600 of the embodiment, light emitted from the light emitting element section 603 is outputted to pass through the element substrate 601.

The sealing substrate 620, which is made of glass or metal, is bonded to the element substrate 601 with a sealing resin interposed therebetween. A getter agent 621 is bonded to the surface, which faces the element substrate 601, of the sealing substrate 620. The getter agent 621 absorbs water or oxygen entering the space 622 formed between the element substrate 601 and the sealing substrate 620 so as to prevent the light emitting element section 603 from being deteriorated by the water or the oxygen which has entered the space 622. The getter agent 621, however, may be omitted.

The element substrate 601 has the discharged regions Q on the circuit element section 602 as described above. The element substrate 601 is provided with banks 618 for defining the discharged regions Q, electrodes 613 formed in the discharged regions Q, and positive hole injection/transportation layers 617a layered on the electrodes 613. The element substrate is provided with the light emitting element section 603 serving as a color element and including the light emitting layers 617R, 617G, and 617B, which are formed in the respective discharged regions Q with respective liquid bodies containing light emitting layer forming materials of three kinds. The bank 618 is composed of a lower layer bank 618a and an upper layer bank 618b that practically define the discharged regions Q. The lower layer bank 618a is provided so as to protrude inside the discharged regions Q. The lower layer bank 618a is made of an inorganic insulating material such as $SiO_2$ so as to prevent an electric short circuit caused by a direct contact of the electrodes 613 with the light emitting layers 617R, 617G, and 617B.

The element substrate 601 is made of a transparent substrate such as glass. On the element substrate 601, an underlayer protection film 606 made of a silicon oxide film is formed. Further, on the underlayer protection film 606, a semiconductor film 607 made of polysilicon is formed to have an island shape. The semiconductor film 607 includes a source region 607a and a drain region 607b formed by high-concentration P ion implantation. A region where P is not ion-implanted serves as a channel region 607c. Additionally, a transparent gate insulation film 608 covering the underlayer protection film 606 and the semiconductor film 607 is formed. On the gate insulation film 608 is formed a gate electrode 609 made of Al, Mo, Ta, Ti, W or the like. On the gate electrode 609 and the gate insulation film 608 are formed first and second interlayer insulation films 611a and 611b which are transparent. The gate electrode 609 is disposed at a position corresponding to the channel region 607c of the semiconductor film 607. Furthermore, contact holes 612a and 612b that penetrate through the first and the second interlayer insulation films 611a and 611b are formed to be respectively coupled to the source region 607a and the drain region 607b of the semiconductor film 607. On the second interlayer insulation film 611b, the electrode 613, which is transparent and made of indium tin oxide (ITO), is patterned into a predetermined shape and arranged (in an electrode formation step). The contact hole 612a is coupled to the electrode 613. The contact hole 612b is coupled to a power supply line 614. Thus, driving thin film transistors 615 connected to the electrodes 613 are formed in the circuit element section 602. The circuit element section 602 includes a retention capacitance and a switching thin film transistor, although not shown in FIG. 13.

The light emitting element section 603 includes the electrodes 613 serving as positive electrodes, the positive hole injection/transportation layers 617a, the light emitting layers 617R, 617G and 617B (generally referred to as a light emitting layer 617b), and a negative electrode 604 layered to cover the upper layer banks 618b and the light emitting layers 617b. These are sequentially layered on the electrodes 613. Using a transparent material to form the negative electrode 604, the sealing substrate 620 and the getter agent 621 allows an emitted light to be outputted through the sealing substrate 620.

The organic EL device 600 includes a scan line (not shown) coupled to the gate electrode 609 and a signal line (not shown) coupled to the source region 607a. When the switching thin film transistor (not shown) is turned on, a scan signal transmitted to the scan line is retained at a potential of the signal line at this point in time by the retention capacitance. A status of the retention capacitance determines ON or OFF of the driving thin film transistor 615. Then, electric current flows from the power supply line 614 to the electrode 613 through the channel region 607c of the driving thin film transistor 615, and then, flows into the negative electrode 604 through the positive hole injection/transportation layer 617a and the light emitting layer 617b. The light emitting layer 617b emits light according to an amount of the current flowing therethrough. The light emitting mechanism of the light emitting element section 603 enables the organic EL device 600 to display desired characters, images, and the like.

Method for Manufacturing Organic EL Device

Figure 14:
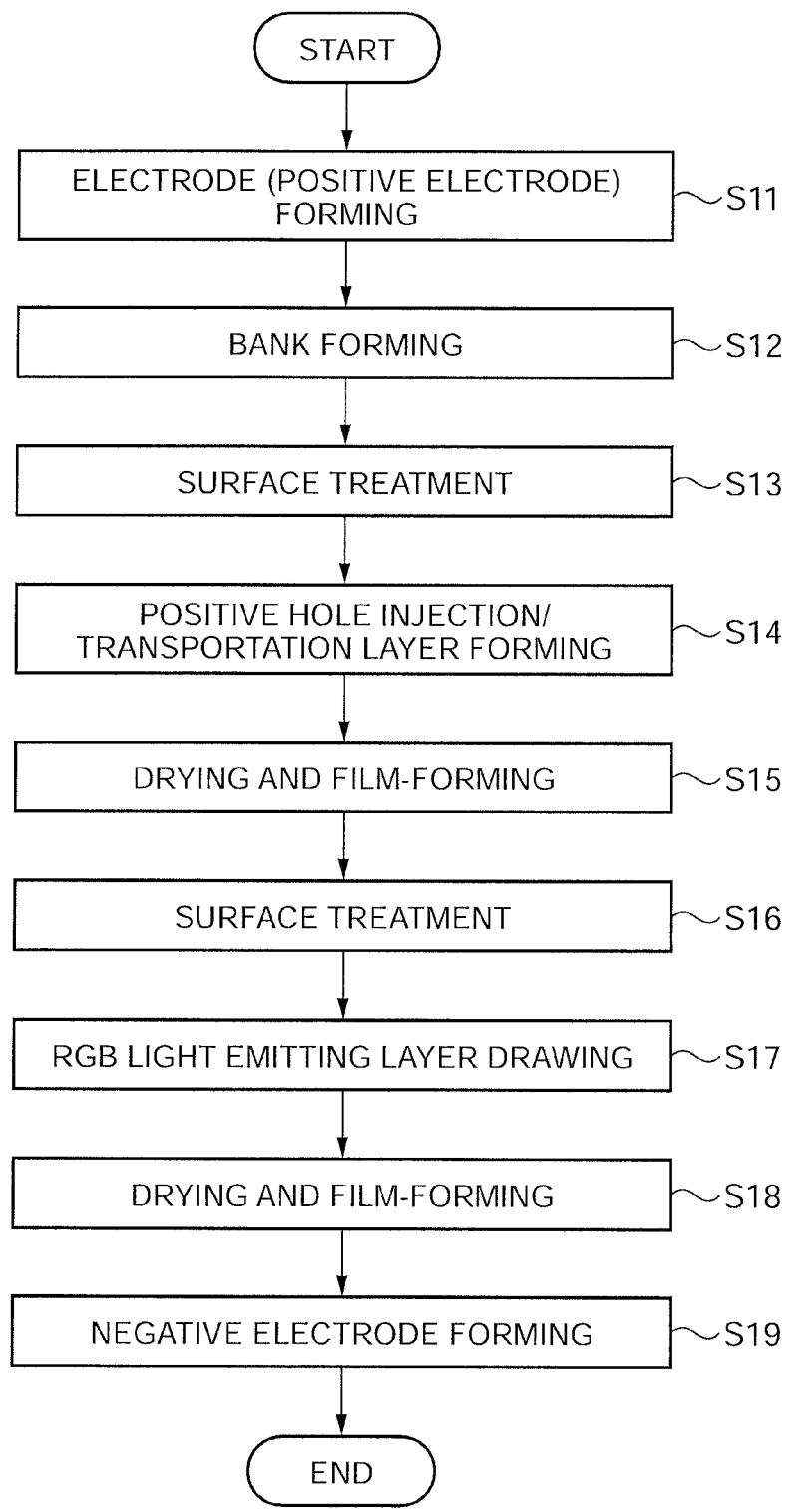
FIG. 14 is a flowchart showing a method for manufacturing an organic EL device.
Figure 15A:
FIGS. 15A to 15F are schematic sectional views showing the method for manufacturing an organic EL device.
Figure 15B:
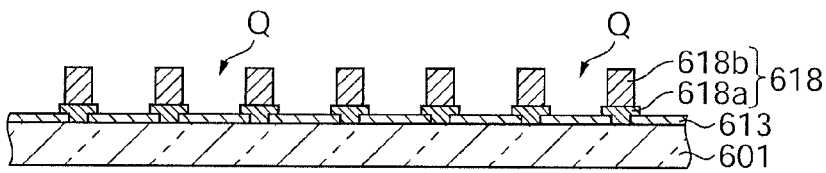
Figure 15C:
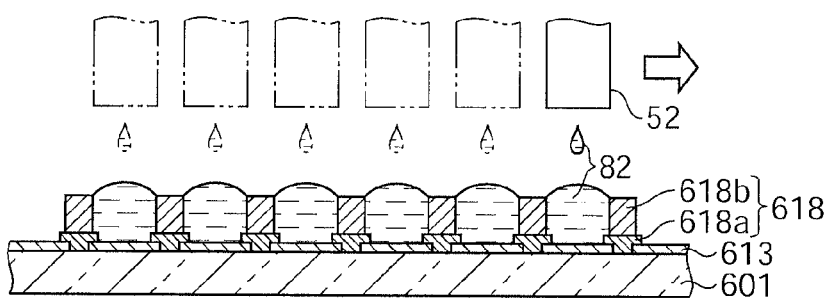
Figure 15D:
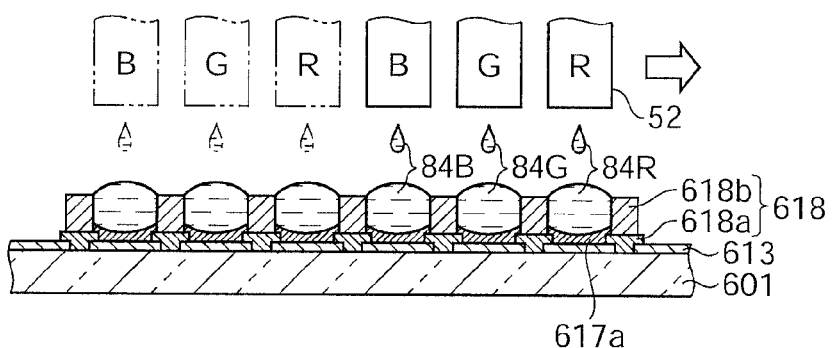
Figure 15E:
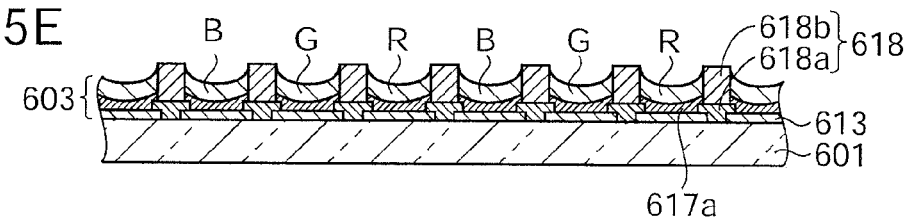
Figure 15F:
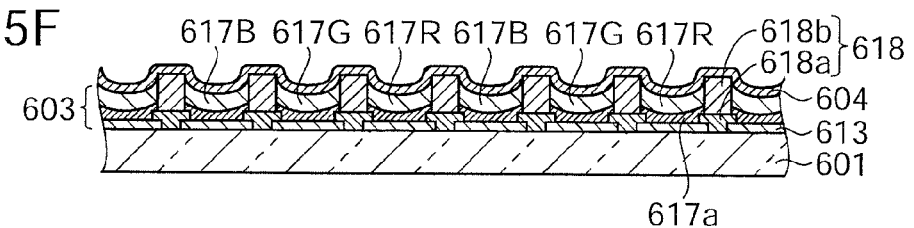

A method for manufacturing an organic EL device of the embodiment is described with reference to FIGS. 14 to 15F. FIG. 14 is a flowchart of the method for manufacturing an organic EL device. FIGS. 15A to 15F are sectional views schematically showing the method for manufacturing an organic EL device. In FIGS. 15A to 15F, the circuit element section 602 formed on the element substrate 601 is not shown.

As shown in FIG. 14, the method for manufacturing an organic EL display includes a step for forming the electrodes 613 at positions corresponding to the plurality of the discharged regions Q of the element substrate 601 and a bank (partition wall section) forming step in which the lower layer bank 618a is formed so that a part thereof overlaps with the electrode 613 and then the upper layer bank 618b is formed on the lower layer bank 618a so as to practically define the discharged regions Q. Further, the method includes a step for performing a surface treatment of the discharged regions Q defined by the upper layer bank 618b, a step for discharge-drawing the positive hole injection/transportation layer 617a by applying a liquid body including a positive hole injection/transportation layer material to the discharged regions Q, and a step for drying the discharged liquid body to form the hole injection/transportation layer 617a. The method furthermore includes a step for performing a surface treatment of the discharged regions Q in which the positive hole injection/transportation layer 617a is formed, a light emitting layer drawing step as a color element drawing step in which the light emitting layer 617b is discharge-drawn by applying three kinds of liquid bodies containing light emitting layer forming materials as a color element forming material on the surface of the discharged regions Q on which the surface treatment has been performed, and a step for drying the discharged three kinds of the liquid bodies to form the light emitting layers 617b. Furthermore, the method includes a step for forming the negative electrode 604 for covering the upper banks 618b and the light emitting layers 617b. The liquid bodies are applied to the discharged regions Q by using the liquid body discharge device 10.

A step S11 of FIG. 14 is a step for forming an electrode (a positive electrode). In the step S11, as shown in FIG. 15A, the electrodes 613 are formed at positions corresponding to the discharged regions Q of the element substrate 601 on which the circuit element section 602 has been formed. As a formation method, a transparent electrode film made of a transparent electrode material such as ITO is formed on a surface of the element substrate 601 by sputtering or vapor deposition in a vacuum, for example. Thereafter, the electrode film is etched by photolithography so as to leave necessary parts to form the electrodes 613. Alternatively, the following method may be employed. The element substrate 601 is covered with a photo-resist, and then the resist is exposed and developed to open regions in which the electrodes 613 are to be formed. Then, a transparent electrode film made of ITO, for example, is formed in the openings. Thereafter, remaining photo resist is removed. Then, the process goes to a step S12.

The step S12 of FIG. 14 is a step for forming a bank (a partition wall section). In the step S12, as shown in FIG. 15B, the lower layer banks 618a are formed so as to cover parts of the electrodes 613 of the element substrate 601. The lower layer banks 618a are made of $SiO_2$ (silicon dioxide) that is an inorganic insulating material. The lower layer banks 618a are formed as follows, for example. The surfaces of the electrodes 613 are masked with a resist or the like in a manner corresponding to the light emitting layers 617b which are formed later. Then, the element substrate 601 having been masked is put into a vacuum apparatus. In the apparatus, the lower banks 618a are formed by sputtering or vacuum vapor depositing $SiO_2$ as a target or a material. The masking made of the resist or the like is removed later. Since the lower layer bank 618a is made of $SiO_2$, it has a sufficient transparency as long as the film thickness is 200 nm or less. Therefore, although the positive hole injection/transportation layers 617a and the light emitting layers 617b are layered later, light is emitted without being hindered.

Next, the upper layer bank 618b is formed on the lower layer bank 618a so as to practically define the discharged regions Q. Preferably, the upper layer bank 618b is made of a material that is durable against solvents of three kinds of liquid bodies 84R, 84G and 84B containing a light emitting layer forming material to be described later. More preferably, the upper layer bank 618b is made of an organic material such as an acryl resin, an epoxy resin, and a photosensitive polyimide which can be changed to tetrafluoroethylene by the plasma treatment using a fluoric gas as a treatment gas. The upper layer bank 618b is formed as follows, for example. The photosensitive organic material is applied by roll coating or spin coating on a surface of the element substrate 601 on which the lower layer bank 618a has been formed. Then the material is dried so as to form a photosensitive resin layer having a thickness of approximately 2 μm. Then, a mask having openings each having a size corresponding to that of each of the discharged regions Q is disposed to face the element substrate 601 at a predetermined position. Then, the applied material is exposed and developed so as to form the upper layer bank 618b. Accordingly, the bank 618 that includes the lower layer bank 618a and the upper layer bank 618b is formed as a partition section. Then, the process goes to the step S13.

The step S13 of FIG. 14 is a step for performing a surface treatment for the discharged regions Q. In the step S13, a plasma treatment is performed on the surface of the element substrate 601, on which the bank 618 has been formed, by using an $O_2$ gas as a treatment gas. The plasma treatment activates surfaces of the electrodes 613, surfaces of the protruded portions of the lower layer banks 618a, and the surfaces (including the wall surfaces) of the upper layer banks 618b as a lyophilic treatment. Next, a plasma treatment is performed on the surface of the element substrate 601 by using a fluoric gas such as $CF_4$ as a treatment gas. The fluoric gas reacts only with the surfaces of the upper layer banks 618b made of the photosensitive resin which is an organic material, providing a lyophilic property to the surfaces of the upper layer banks 618b. Then, the process goes to the step S14.

The step S14 of FIG. 14 is a step for forming the positive hole injection/transportation layer. In the step S14, as shown in FIG. 15C, a liquid body 82 containing a positive hole injection/transportation layer forming material is applied on each of the discharged regions Q. The liquid body 82 is applied with the liquid body discharge device 10 described above. The liquid 82 discharged from the droplet discharge heads 50 lands as droplets and the droplets wet and spread on the electrodes 613 of the element substrate 601. The liquid body 82 is discharged as droplets of a required amount corresponding to an area of each of the discharged regions Q, and is disposed in the regions Q with a raised surface formed by surface tension. Since one kind of the liquid body 82 is discharged so as to draw a pattern by the liquid body discharge device 10, the discharging and drawing can be performed in at least one-time main scanning. Then, the process goes to a step S15.

The step S15 in FIG. 14 is a step for drying and film-forming. In the step S15, the element substrate 601 is heated, for example, by a lamp annealing method to dry and remove a solvent component of the liquid body 82, whereby the positive hole injection/transportation layers 617a are formed in regions, which are defined by the lower layer banks 618a, of the electrode 613. In the embodiment, the positive hole injection/transportation layers are made of polyethylene dioxy thiophene (PEDOT). In this case, the positive hole injection/transportation layers 617a which are formed in the discharged regions Q are made of a single material. However, the material of the positive hole injection/transportation layers 617a may be changed in every discharged region Q in accordance with the material for forming the light emitting layer which is formed later. Then, the process goes to a step S16.

The step S16 of FIG. 14 is a step for performing a surface treatment for the element substrate 601 on which the hole injection/transportation layers 617a are formed. In the step S16, the surface treatment is performed as follows. In a case where the positive hole injection/transportation layers 617a are made of the positive hole injection/transportation layer forming material described above, their surfaces have a lyophobic property to the three kinds of liquid bodies 84R, 84G, and 84G to be used in the following step, that is, a step S17. Therefore, the surface treatment is performed so that at least regions in the discharged regions Q have a lyophilic property. As the surface treatment, a solvent used in the three kinds of the liquid bodies 84R, 84G and 84B is applied and dried. The solvent is applied by spraying, spin coating, or the like. Then, the process goes to a step S17.

The step S17 of FIG. 14 is a step for drawing an RGB light emitting layer. In the step S17, as shown in FIG. 15D, by using the method for disposing a liquid body, the three kinds of the liquid bodies 84R, 84G and 84B containing the light emitting layer forming material are applied to the plurality of the discharged regions Q from the droplet discharge heads 50 of the liquid body discharge device 10. The liquid body 84R contains a material for forming the light emitting layer 617R (red), the liquid body 84G contains a material for forming the light emitting layer 617G (green), and the liquid body 84B contains a material for forming the light emitting layer 617B (blue). Each of the landed liquid bodies 84R, 84G, and 84B spreads to wet the surfaces of the discharged regions Q, and a sectional shape of the liquid body is raised in an arc. Then, the process goes to the step S18.

The step S18 in FIG. 14 is a step for drying and film-forming. In the step S18, as shown in FIG. 15E, a solvent component of each of the discharged and drawn liquid bodies 84R, 84G, and 84B is dried and removed so as to laminate the light emitting layers 617R, 617G and 617B on respective positive hole injection/transportation layers 617a of the discharged regions Q. The element substrate 601 on which the liquid bodies 84R, 84G and 84B are discharged and drawn is preferably dried by reduced pressure drying, which allows the evaporation speed of the solvent to be approximately constant. Then, the process goes to a step S19.

The step S19 of FIG. 14 is a step for forming a negative electrode. In the step S19, as shown in FIG. 15F, the negative electrode 604 is formed so as to cover each of the light emitting layers 617R, 617G and 617B and the surface of the upper layer bank 618b on the element substrate 601. Preferably, the negative electrode 604 is made of a combination of metals such as Ca, Ba and Al and a fluoride such as LiF. In particular, it is preferable that a film made of Ca, Ba, or LiF having a small work function be formed on a side near the light emitting layer whereas a film made of Al or the like having a large work function be formed on a side distant from the light emitting layer. In addition, a protection layer made of $SiO_2$, SiN, or the like may be layered on the negative electrode 604. The protection layer can prevent the negative electrode 604 from being oxidized. The negative electrode 604 may be formed by vapor deposition, sputtering, chemical vapor deposition (CVD), or the like. Among these, the vapor deposition is preferable since it can prevent a damage of the negative electrode which is caused by heat of the light emitting layer. By using thus formed element substrate 601, the organic EL device 600 is manufactured.

Advantageous effects of the fourth example will be described below.

(1) According to the method for manufacturing the organic EL device 600, the light emitting layers 617R, 617G, and 617B can be formed by discharging the three kinds of liquid bodies 84R, 84G, and 84B by using the method for discharging a liquid body to two kinds of discharged regions Q which have different areas from each other and have arrangement directions orthogonal to each other, in the color element drawing step. The method can reduce unevenness in the thickness of the light emitting layers 617R, 617G, and 617B formed in the two kinds of discharged regions Q, and can manufacture at least two kinds of organic EL devices 600, of which arrangement directions of light emitting element sections 603 serving as organic EL elements are different from each other, with high productivity.

The embodiment of the invention can be modified in various manners within the scope of the invention. The followings are modifications of the embodiment described above, for example.

First Modification

The layout of the first panels E1 and the second panels E2 on the mother substrate B is not limited to the above embodiment but it is an example. The first panels E1 and the second panels E2 may be arranged in any layout as long as the layout has certain regularity. The first discharged regions and the second discharged regions of the embodiment are arranged in a stripe layout, but the layout is not limited. They may be arranged in a mosaic layout or in a delta layout.

Second Modification

In the above embodiment, the first discharged regions and the second discharged regions have different areas, but they are not limited. For example, even in a case where the first discharged regions and the second discharged regions have the same areas and have different arrangement directions, more number of nozzles 52 can be allocated to the short side of the discharged region, of which the short side is disposed along the nozzle line 52a, by using the above-described method for discharging a liquid body. This reduces concentrated discharge of the liquid body to a certain part in the discharged region and resulting imbalance of the discharge amount of the liquid body.

What is claimed is:
1. A method for discharging a liquid body, comprising:
arranging a first panel and a plurality of second panels on a substrate, the first panel including a plurality of first discharged regions each of which has a generally rectangular shape, each of the second panels including a plurality of second discharged regions each of which has a generally rectangular shape, each of the second panels being smaller than the first panel, each of the first discharged regions being disposed on the first panel to set a long side thereof along a prescribed direction, each of the second discharged regions having a smaller area than each of the first discharged regions and being disposed to set a long side thereof generally orthogonal to the long side of each of the first discharged regions, the first panel and the second panels being aligned along the prescribed direction and being arranged so as not to be aligned along a direction in which the long side of each of the second discharged regions extends, the second panels facing the first panel in the prescribed direction; and discharging the liquid body to the first discharged regions and the second discharged regions from a plurality of nozzles while a plurality of droplet discharge heads, the heads having a nozzle line having the plurality of nozzles that discharge the liquid body as droplets and are arranged in a linear manner, and the substrate, are relatively moved in a main scan direction that is generally orthogonal to an arrangement direction of the droplet discharge heads, each of the first discharged regions being disposed to set the long side thereof along the main scan direction in the discharging, a discharge amount of the liquid body discharged from each of the plurality of nozzles with a single discharge being kept constant for the first discharged regions and the second discharged regions.

2. The method for discharging a liquid body according to claim 1, wherein at least two nozzles face a region, in a direction of a short side of each of the first discharged regions, of the first discharged regions.

3. The method for discharging a liquid body according to claim 1, wherein an arranging pitch between the droplets, the droplets being discharged from the nozzles and arranged in the first discharged regions, in the direction of a short side of each of the first discharged regions can be adjusted by disposing the nozzle line at an angle with the direction of the short side.

4. The method for discharging a liquid body according to claim 1, wherein in the discharging, the droplet discharge heads and the substrate are relatively moved in a sub scan direction that is generally orthogonal to the main scan direction in a plurality of relative moves between the droplet discharge heads and the substrate in the main scan direction.

5. A method for manufacturing a color filter, comprising:

discharging liquid bodies, the liquid bodies containing a colored layer forming material, of a plurality of colors to the first discharged regions and the second discharged regions by using the method for discharging a liquid body of claim 1; and solidifying the liquid bodies being discharged so as to form colored layers of the plurality of colors on the substrate, the second discharged regions having an arrangement direction orthogonal to that of the first discharged regions.

6. A method for manufacturing an organic electroluminescence (EL) device including a plurality of organic EL elements having functional layers having light emitting layers, in the first discharged regions and the second discharged regions, the method comprising:

discharging a liquid body containing a light emitting layer forming material in the first discharged regions and the second discharged regions on the substrate by using the method for discharging a liquid body of claim 1; and solidifying the liquid body being discharged so as to form the light emitting layers, the second discharged regions having an arrangement direction orthogonal to that of the first discharged regions.

* * * * *